US007859844B2

(12) United States Patent
Nguyen et al.

(10) Patent No.: US 7,859,844 B2
(45) Date of Patent: Dec. 28, 2010

(54) ENERGY STORAGE COOLING SYSTEM

(75) Inventors: Vinh-duy Nguyen, Escondido, CA (US);
Alexander J. Smith, Poway, CA (US);
Kevin T. Stone, San Diego, CA (US);
Alfonso O. Medina, San Diego, CA (US)

(73) Assignee: ISE Corporation, Poway, CA (US)

( * ) Notice: Subject to any disclaimer, the term of this patent is extended or adjusted under 35 U.S.C. 154(b) by 0 days.

(21) Appl. No.: 12/826,509

(22) Filed: Jun. 29, 2010

(65) Prior Publication Data

US 2010/0265660 A1    Oct. 21, 2010

Related U.S. Application Data

(63) Continuation of application No. 12/343,970, filed on Dec. 24, 2008, now Pat. No. 7,764,496, which is a continuation of application No. 12/343,271, filed on Dec. 23, 2008.

(51) Int. Cl.
*H05K 7/20* (2006.01)
(52) U.S. Cl. .................. 361/697; 361/690; 361/15; 361/42; 361/514; 361/695; 429/120; 429/99; 320/107; 320/112; 307/147; 307/148
(58) Field of Classification Search ............. 361/15, 361/42, 502, 511, 514, 517, 141, 679.46–53, 361/690–697, 707–712, 715, 716, 301.3, 361/306.1, 830, 831, 106; 429/24, 26, 99, 429/120; 307/147, 148, 150; 320/107, 112, 320/116; 165/80.2, 80.3, 80.4, 80.5, 104.33, 165/104.34, 121–126, 43; 318/138, 254, 318/439, 538, 722, 801
See application file for complete search history.

(56) References Cited

U.S. PATENT DOCUMENTS

| | | | | |
|---|---|---|---|---|
| 6,326,761 B1 * | 12/2001 | Tareilus | ...................... | 318/722 |
| 6,422,027 B1 * | 7/2002 | Coates et al. | .............. | 62/259.2 |
| 6,445,582 B1 * | 9/2002 | Oda et al. | .................... | 361/695 |
| 6,579,642 B2 * | 6/2003 | Yamane et al. | .............. | 429/120 |
| 6,914,414 B2 * | 7/2005 | Hamada et al. | ............. | 320/107 |
| 6,953,638 B2 * | 10/2005 | Inui et al. | ................... | 429/120 |
| 7,189,474 B2 * | 3/2007 | Hamada et al. | ............. | 429/120 |
| 7,399,551 B2 * | 7/2008 | Yagi et al. | ................... | 429/148 |
| 7,642,003 B2 * | 1/2010 | Ahn et al. | ................... | 429/120 |
| 7,733,065 B2 * | 6/2010 | Yoon et al. | .................. | 320/150 |
| 2008/0280192 A1 * | 11/2008 | Drozdz et al. | ................. | 429/62 |

\* cited by examiner

*Primary Examiner*—Michael V Datskovskiy
(74) *Attorney, Agent, or Firm*—Stephen C. Beuerle; Procopio Cory Hargreaves & Savitch LLP

(57) ABSTRACT

An energy storage pack cooling system including upper and lower respective terminal heat sinks thermally connected to respective upper and lower terminals of energy storage cells above and below upper and lower ends of an enclosure of an energy storage cell pack; and a blower and cooling assembly that circulates a heat transfer fluid past the upper and lower respective terminal heat sinks outside of the enclosure to cool the energy storage cells without circulating the heat transfer fluid past energy storage cell bodies of the energy storage cells enclosed within the enclosure.

19 Claims, 13 Drawing Sheets

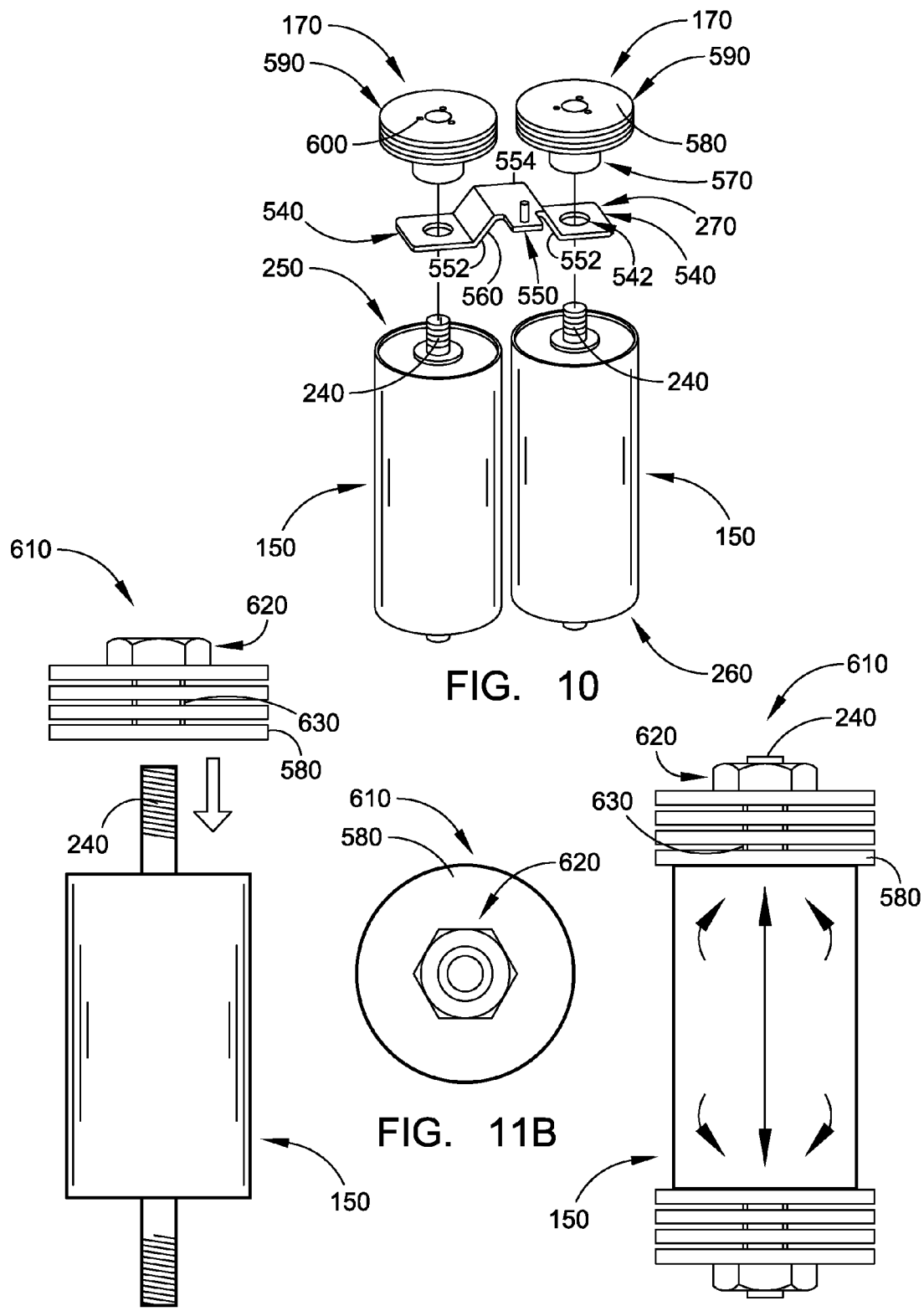

ENERGY STORAGE COOLING SYSTEM

RELATED APPLICATION

This application is a continuation of U.S. patent application Ser. No. 12/343,970, filed Dec. 24, 2008, which is a continuation of U.S. patent application Ser. No. 12,343,271, filed Dec. 23, 2008. All of the above patent applications are incorporated by reference herein.

FIELD OF THE INVENTION

The field of the invention generally relates to an energy storage specially adapted for a hybrid electric vehicle. In particular, the invention relates to a high-voltage, high-power ultracapacitor energy storage pack composed of a large number of serially connected individual low-voltage ultracapacitor cells that store propulsion energy.

BACKGROUND OF THE INVENTION

The connecting together of individual battery cells for high-voltage, high-energy applications is well known. However, the chemical reaction that occurs internal to a battery during charging and discharging typically limits deep-cycle battery life to hundreds of charge/discharge cycles. This characteristic means that the battery pack has to be replaced at a high cost one or more times during the life of a hybrid-electric or all-electric vehicle.

Batteries are somewhat power-limited because the chemical reaction therein limits the rate at which batteries can accept energy during charging and supply energy during discharging. In a hybrid-electric vehicle application, the battery power limitation manifests itself as an internal series resistance that restricts the drive system efficiency in capturing braking energy through regeneration and supplying power for acceleration.

Ultracapacitors are attractive because they can be connected together, similar to batteries, for high-voltage applications; have an extended life of hundreds of thousands of charge/discharge cycles; and have a low equivalent internal series resistance that allows an ultracapacitor pack to accept and supply much higher power than similar battery packs. Although ultracapacitor packs may be more expensive than battery packs for the same applications and currently cannot store as much energy as battery packs, ultracapacitor packs are projected to last the life of the vehicle and offer better fuel-efficient operation through braking regeneration energy capture and supplying of vehicle acceleration power. Furthermore, the price of an ultracapacitor pack has the potential to decrease significantly because of economies of scale in known manufacturing techniques.

During charging and discharging operation of the ultracapacitors, parasitic effects, as modeled by the equivalent series resistance, cause the cell temperature to increase. Cooling is required to minimize increased temperature operation that would degrade the energy storage and useful life of each ultracapacitor.

Other than operation/performance, the key consideration for ultracapacitor packs in a heavy duty hybrid-electric vehicle is heat dissipation. The ultracapacitor cells used in ultracapacitor packs are constructed as layered sheets of conductive material and dielectric, wrapped around a central axis and forming a cylinder. Terminals are placed on each end of the cell. The terminals are typically threaded and provide both an electrical coupling point and a support point. The thermal characteristics of this construction are such that most of heat generated by the cell is transferred to the environment via the two ends of the cell. Currently, heat dissipation is accomplished by blowing cooling air across the cylindrical bodies/cases of the cells.

Ultracapacitor packs in vehicles, especially heavy-duty vehicles, reside in a harsh operating environment and face unique challenges not present in non-vehicular applications. In particular, the vehicular environment is dirty, hot, and subject to vibration. Current implementations attempt to address these problems, but leave room for improvement and innovation.

In heavy-duty transit bus applications and other heavy duty vehicle applications higher performance and smaller size ultracapacitor packs are required, especially where ultracapacitor packs are required to be placed on the roof of the heavy-duty transit bus or other heavy duty vehicle.

SUMMARY OF THE INVENTION

An aspect of the invention involves an energy storage pack cooling system for an energy storage cell pack including multiple rows of vertically oriented energy storage cells that radiate heat in a longitudinal axial direction upwards and downwards towards opposite respective upper and lower electrically conductive and heat conductive terminals, the energy storage cells further including an energy storage cell body, the energy storage cell pack including an enclosure with upper and lower ends that encloses the energy storage cell bodies of the energy storage cells while exposing the upper and lower terminals out of the respective upper and lower ends of the enclosure. The energy storage pack cooling system includes upper and lower respective terminal heat sinks thermally connected to the respective upper and lower terminals above and below the upper and lower ends of the enclosure and a blower and cooling assembly that circulates a heat transfer fluid past the upper and lower respective terminal heat sinks outside of the enclosure to cool the energy storage cells without circulating the heat transfer fluid past the energy storage cell bodies of the energy storage cells enclosed within the enclosure.

BRIEF DESCRIPTION OF THE DRAWINGS

The accompanying drawings, which are incorporated in and form a part of this specification, illustrate embodiments of the invention and together with the description, serve to explain the principles of this invention.

FIG. 10 is a perspective view of an embodiment of terminal heat sinks and an interconnect for a pair of ultracapacitors.

FIG. 11A is a side elevational view of another embodiment of a terminal heat sink being applied to an ultracapacitor.

FIG. 11B is a top plan view of the terminal heat sink of FIG. 11A.

FIG. 11C is a side elevational view of the terminal heat sink of FIG. 11A shown applied to the ultracapacitor.

DETAILED DESCRIPTION OF THE INVENTION

This disclosure of the invention is submitted in furtherance of the constitutional purposes of the U.S. patent Laws "to promote the progress of science and useful arts" (Article 1, Section 8).

Figure 1:
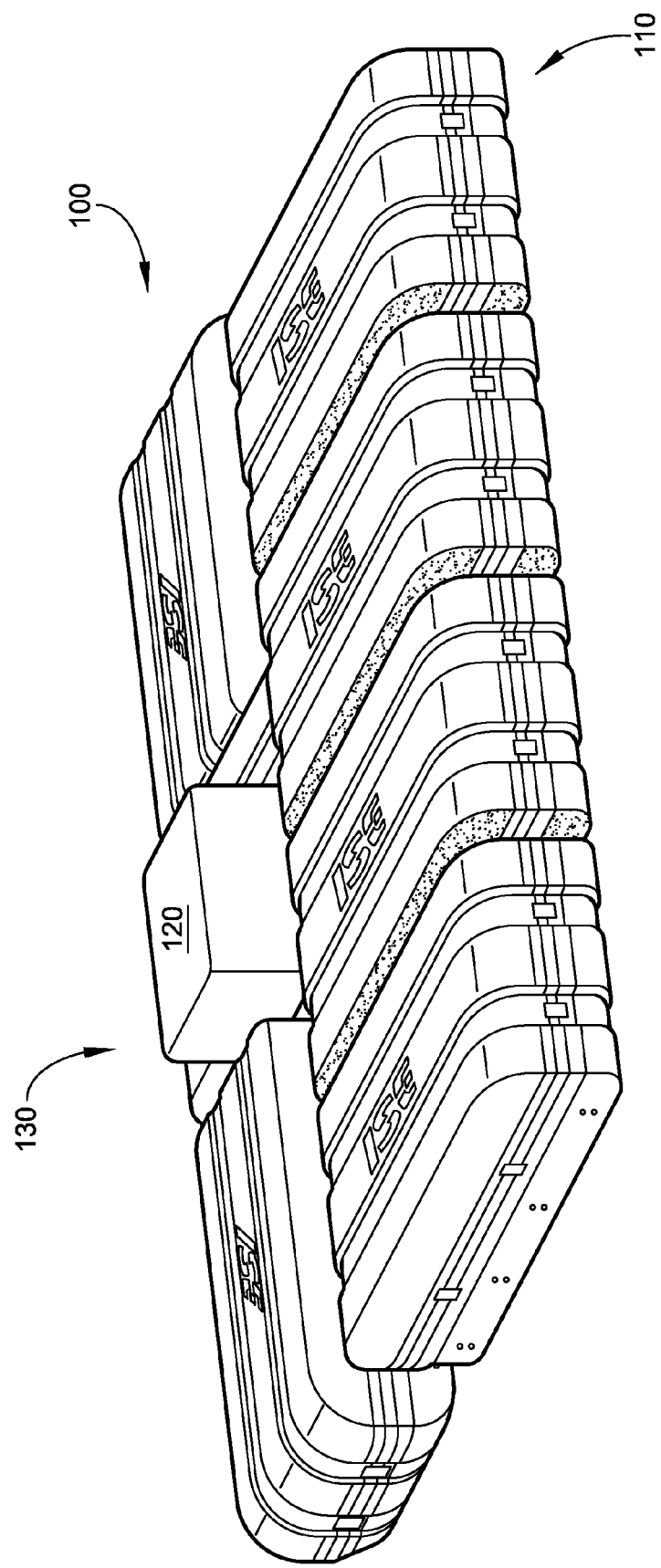
FIG. 1 is a top plan and perspective views of an embodiment of an ultracapacitor pack system.

With reference to FIG. 1, an ultracapacitor energy storage system 100 constructed in accordance with an embodiment of the invention will be described. The ultracapacitor energy storage system 100 includes a plurality of ultracapacitor energy storage cell packs 110 connected to a central water chiller 120 or cooling supply for cooling ultracapacitors of the ultracapacitor energy storage cell packs 110, and a controller 130 for controlling cooling of the ultracapacitor energy storage cell packs 110 and/or controlling electrical functions (and/or other functions) of the ultracapacitor energy storage cell packs 110. As illustrated in this particular embodiment, each ultracapacitor energy storage cell pack 110 here includes 48 (6×8) ultracapacitors oriented so that the longitudinal axis of each ultracapacitor is vertically oriented. This configuration, along with the compact nature of each ultracapacitor energy storage cell pack 110, provides for low profile, modular ultracapacitor energy storage cell packs 110 that can be arranged in a variety of different configurations and numbers to provide the desired energy storage for the particular application. For example, FIG. 1 shows an exemplary configuration of six ultracapacitor energy storage cell packs 110 for assembly onto a rooftop of a metropolitan transit bus for supplying power to propel the bus. In other applications, different configurations, arrangements/orientations, and/or numbers of ultracapacitor energy storage cell packs 110 may be provided. In alternative embodiments, the inventive principles described herein are applied to batteries in a battery pack or other power supplies in a power supply pack.

Figure 2:
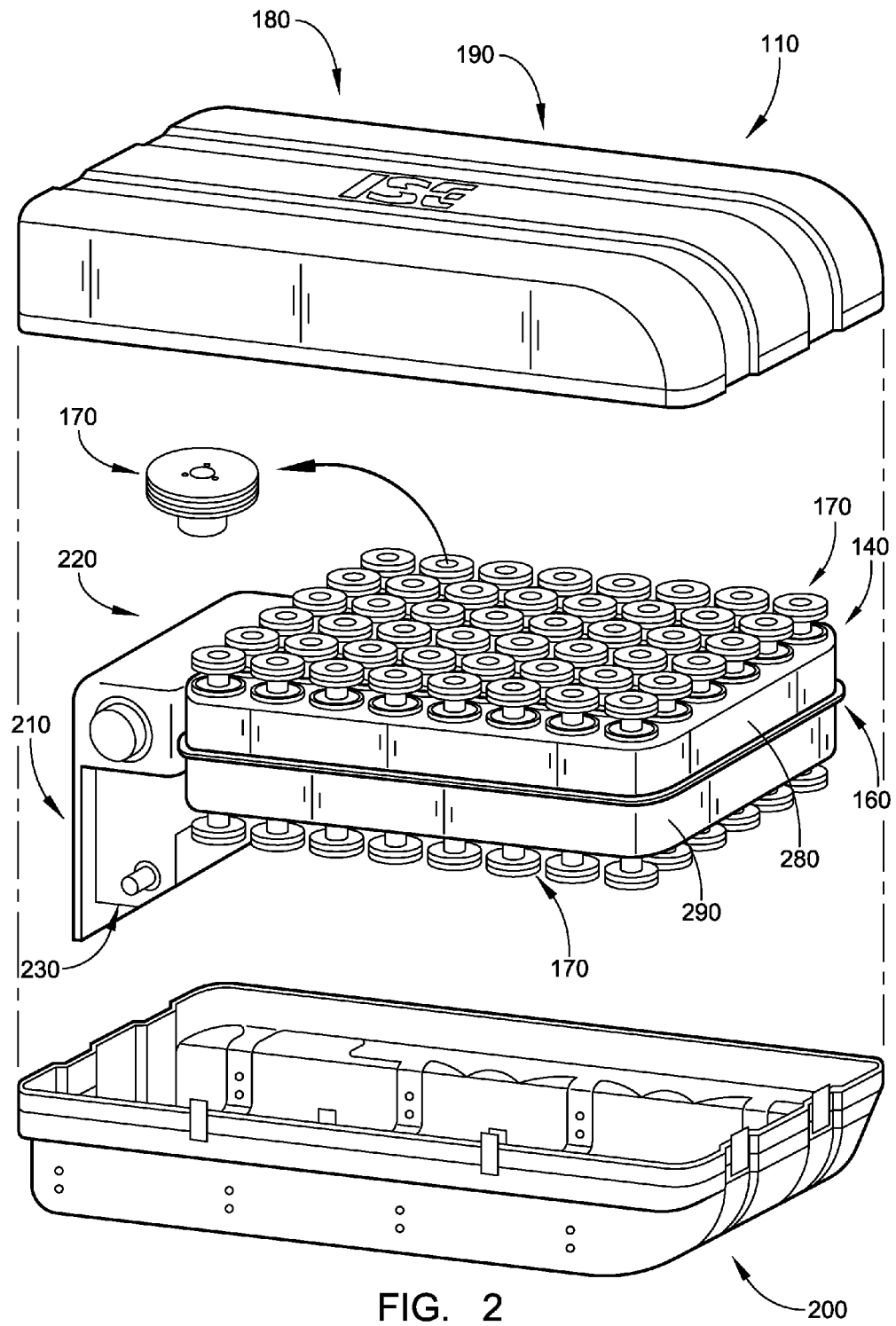
FIG. 2 is an exploded perspective view of an embodiment of an ultracapacitor energy storage cell pack of the ultracapacitor pack system illustrated in FIG. 1.
Figure 3:
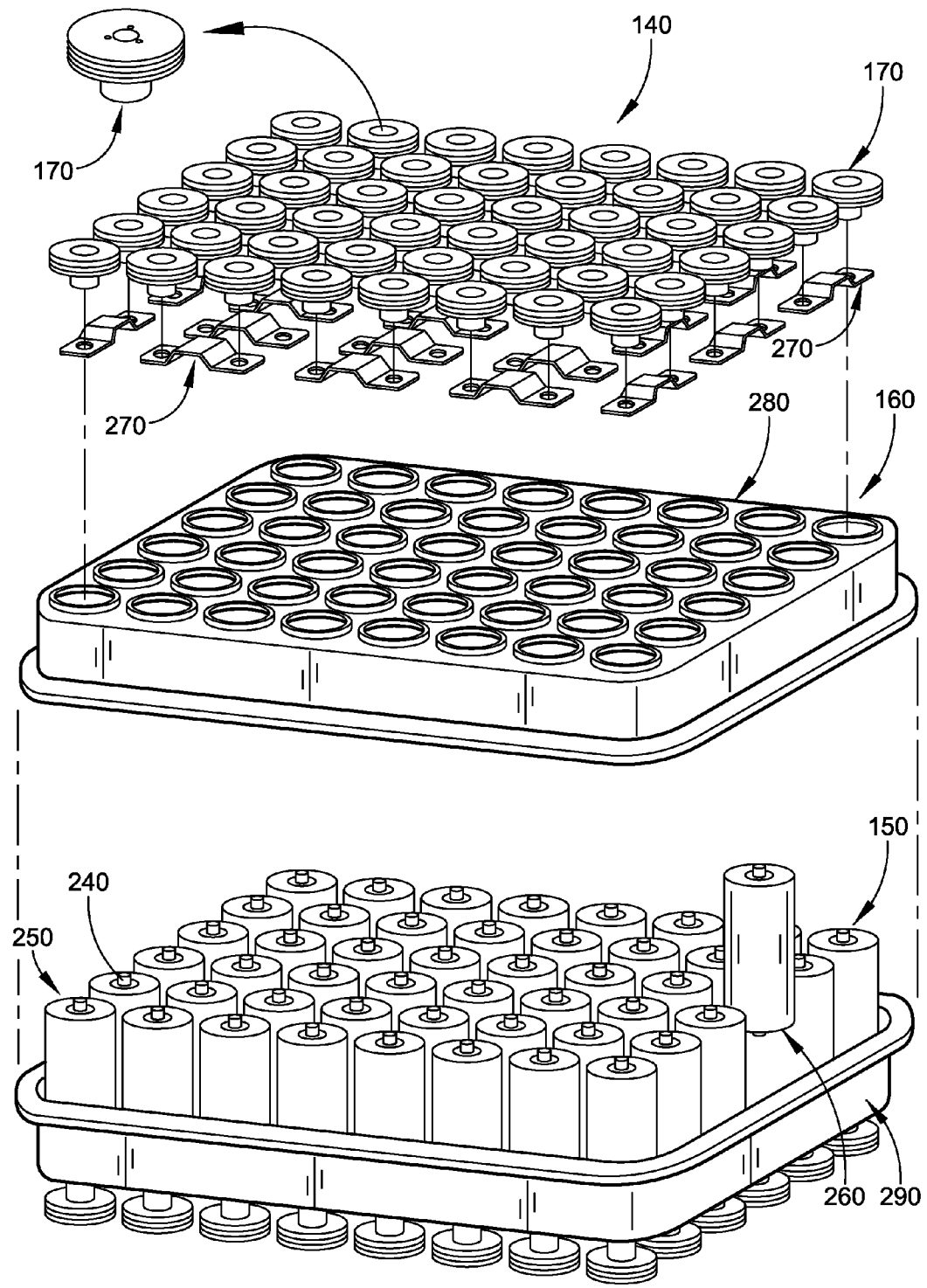
FIG. 3 is an exploded perspective view of an embodiment of an ultracapacitor pack assembly of the ultracapacitor energy storage cell pack of FIG. 2.

FIG. 2 is an exploded perspective view of an embodiment of the ultracapacitor energy storage cell pack 110 of the ultracapacitor energy storage system 100 illustrated in FIG. 1. FIG. 3 is an exploded perspective view of an embodiment of an ultracapacitor pack assembly of the ultracapacitor energy storage cell pack of FIG. 2, further exploding cradle assembly 160. Here, the exemplary ultracapacitor energy storage cell pack 110 includes an ultracapacitor energy storage cell pack assembly 140 with 48 (6×8) ultracapacitors 150 secured in place relative to each other, housed within, and protected by cradle assembly 160. In the embodiment shown, the ultracapacitors 150 are Maxwell—Boostcap® Ultracapacitors model BCAP3000, rated at 3000 Farads, 2.7 Volt operating voltage, >1 million duty cycles.

With reference to FIGS. 3 and 10, terminal heat sinks 170, which are disposed outside of cradle assembly 160 for cooling the ultracapacitors 150 in a manner to be described, are thermally connected to terminals 240 extending from opposite ends 250, 260 of each ultracapacitor 150. Interconnects 270 form an electrical bridging device that electrically connects terminals 240 from adjacent ultracapacitors 150 (to connect the ultracapacitors 150 in series).

Referring to FIG. 2, the ultracapacitor energy storage cell pack 110 includes a housing 180 comprised of an upper cover 190 and a lower cover 200. The housing 180 includes fastener mechanisms for fastening the upper cover 190 to the lower cover 200. On an interior of the covers 190, 200 are structural supports for supporting the ultracapacitor energy storage cell pack assembly 140 at attachment/mounting points on the ultracapacitor energy storage cell pack assembly 140. The attachment/mounting points may be selected such that the pack assembly 140 is oriented in an advantageous orientation. Disposed within one end of the housing 180 is a blower and cooler assembly 210 with a cross flow fan/flow source 220 and a heat exchanger 230. Although not shown, circuitry may be electrically coupled to the terminals 240 in a well-known manner.

Figure 4A:
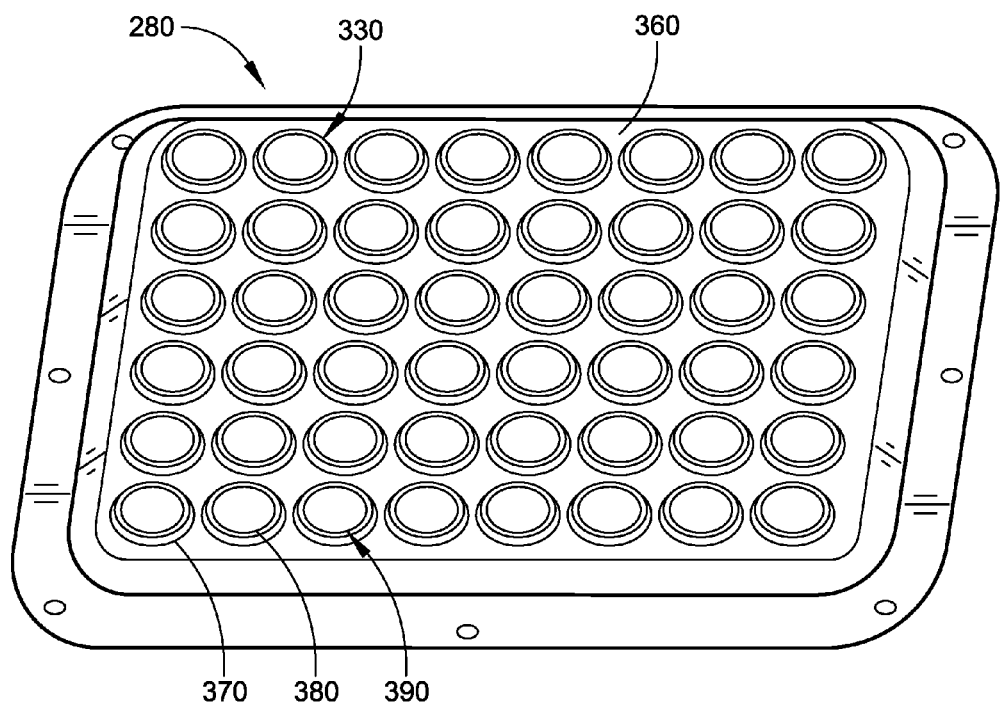
FIG. 4A is a perspective view of an upper cradle member of the ultracapacitor pack assembly of FIG. 3.
Figure 4B:
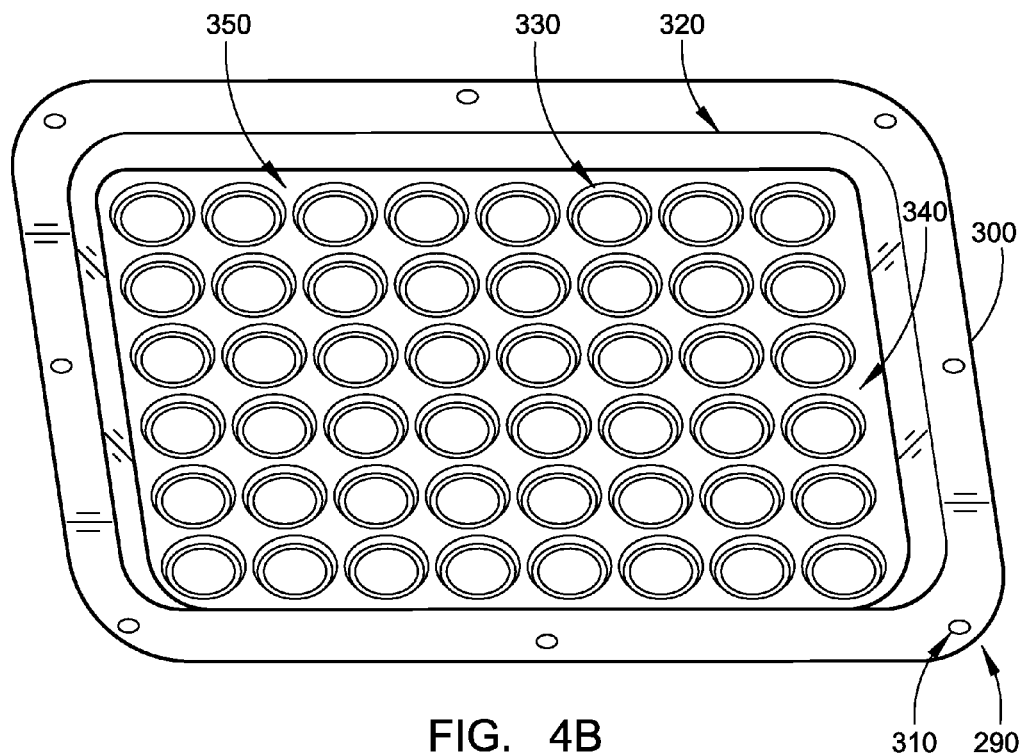
FIG. 4B is a perspective view of a lower cradle member of the ultracapacitor pack assembly of FIG. 3.

With reference to FIGS. 3, 4A, and 4B, the cradle assembly 160 of the ultracapacitor pack assembly 140 will be described in more detail. As illustrated, the cradle assembly 160 includes a vacuum-formed or pressure-formed plastic upper cradle member 280 and a matching vacuum-formed plastic lower cradle member 290 that form respective upper and lower array support structures for holding the ultracapacitors 150 by opposite end portions of the ultracapacitor cell bodies instead of by their terminals 240. In the embodiment shown, the cradle members 280, 290 may be made of a nonconductive material such as FR59 plastic. Each cradle member 280, 290 includes a peripheral flange 300 with spaced bolt holes 310 therein. The flange 300 surrounds a central recessed/raised section 320 (i.e. recessed on an inner surface 350/raised on an outer surface 360). Circular slots 330 are disposed in a wall/partition 340 of each cradle member 280, 290 to provide a terminal interface allowing the ultracapacitor terminals to pass through. Each slot 330 includes a recessed annular wall 330 that projects outwardly from outer surface 360. The annular wall 330 has a diameter slightly smaller than an exterior diameter of the ultracapacitor 150 for securably receiving (i.e., to provide spring force and/or grip on) the end portions 250, 260 of the ultracapacitor 150. In certain applications, the cradle assembly 160 may be further configured to direct air flow across the terminals. For example, the cradle assembly 160 may include vanes and/or form ducting such that air/coolant does not bleed out of the desired flow path, such that additional coolant is directed toward "hot spots" on the pack, such that back pressure on the flow source is reduced, etc.

One of the many advantages of the cradle assembly 160 is that it enables the ultracapacitors 150 to be placed closer together than was possible in the past, making for a more compact ultracapacitor pack assembly 140. To this end, the slots 330 are disposed very close to one another. An additional advantage of disposing the slots 330 so close together is that the annular walls 330 are disposed close enough together so that the plastic material that forms structural support for one annular wall 330 adds to the structural support and rigidity of an adjacent annular wall 330. This increases the structural support provided by the slots/cups 330, increasing the structural support of the cradle assembly 160 (i.e., the plastic material forming the annular walls 330 doubles in on itself to form the additional structural support.

The annular wall 330 terminates at a proximal end in the wall/partition 340 and terminates at a distal end in annular flange 380. Annular flange 380 extends radially inwardly from the annular wall 330 and includes a central hole 390 with a diameter larger than an outer diameter of the terminal 240 (so the terminal 240 can pass there through) and smaller than the outer diameter of the ultracapacitor 150 so that the end portions 250, 260 of the ultracapacitor 150 abut the annular flange 380 while the terminal 240 passes through the hole 390. Thus, the circular slots 330 form cups for securably receiving end portions 250, 260 of the ultracapacitors 150.

Preferably the ultracapacitors 150 are oriented along the dominant axis of vibration (See FIG. 14), which is typically vertically, as shown, for vehicle applications. The ultracapacitors 150 are supported by their cylindrical body/case 434 and end portions/caps 250, 260 rather than by their terminals 240.

Figure 5:
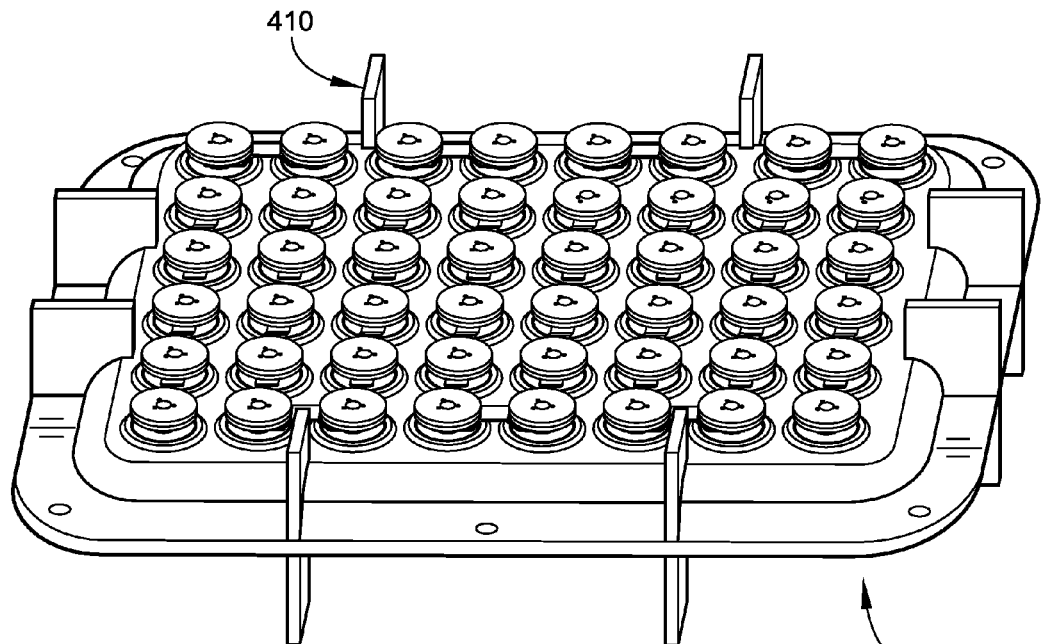
FIG. 5 is a perspective view of an alternative embodiment of an ultracapacitor pack assembly.
Figure 6A:
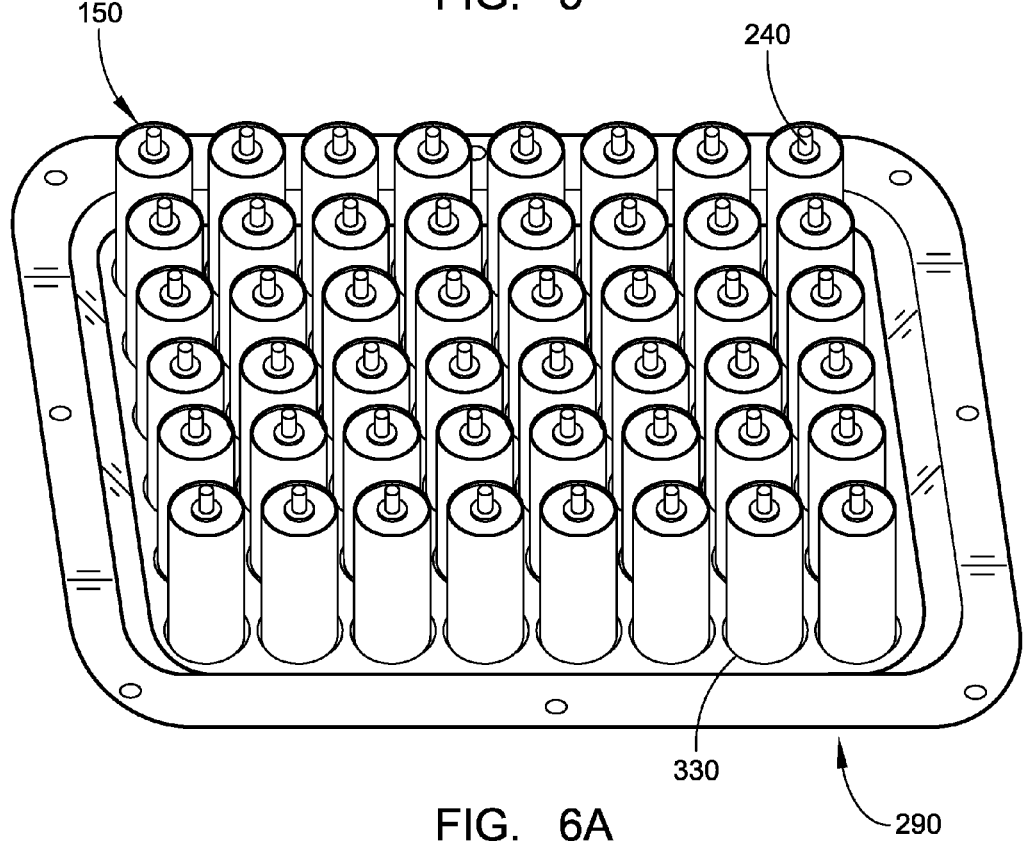
FIG. 6A is a perspective view of the ultracapacitor pack assembly of FIG. 3 after a first step in a method of assembly of the ultracapacitor pack assembly.
Figure 6B:
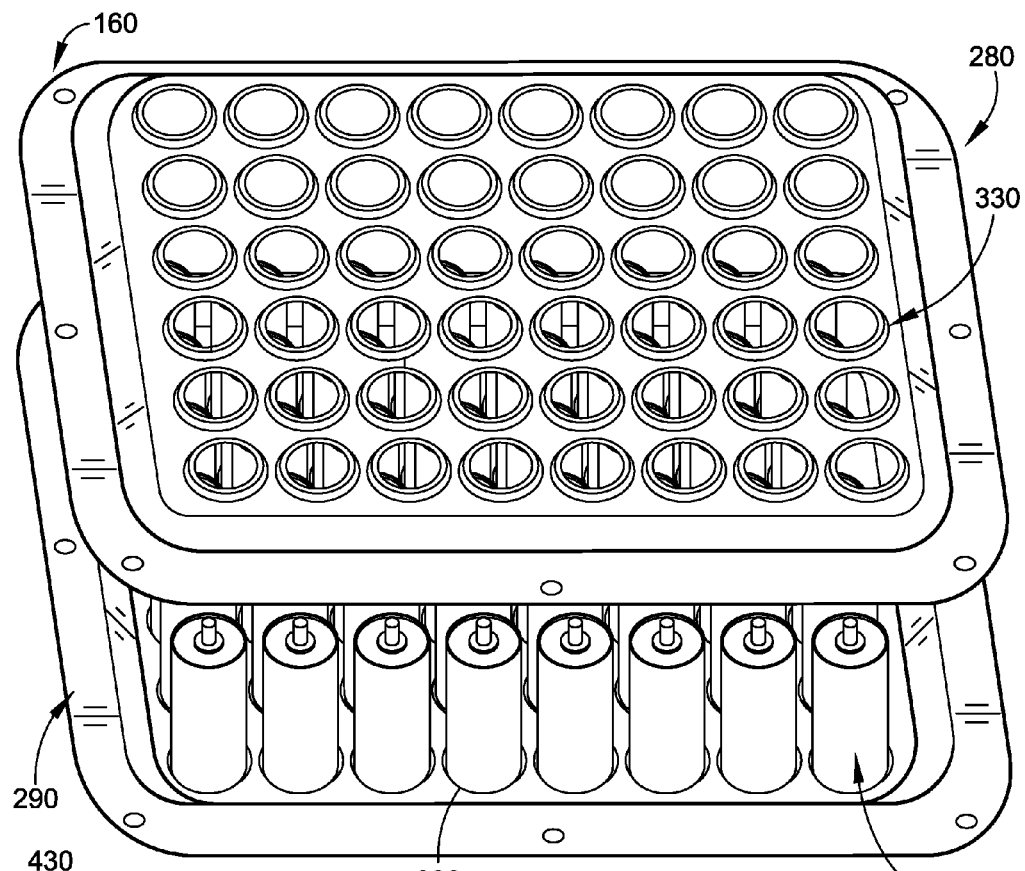
FIG. 6B is a perspective view of the ultracapacitor pack assembly of FIG. 3 after a second step in a method of assembly of the ultracapacitor pack assembly.

With reference to FIG. 5, an alternative embodiment of a cradle assembly 400 is shown. The cradle assembly 400 is similar to the cradle assembly 160 described above except that the cradle assembly 400 includes leg stands 410 for supporting the cradle assembly 400 in the housing 180. In further embodiments, the cradle assembly 160, 400 includes additional or fewer features, such as, but not by way of limitation added stiffening ribs (e.g., integrally formed with the cradle members 280, 290) or separate stiffeners (not shown) added between rows/columns of ultracapacitors 150 to add structure in the cradle members 280, 290 or a smaller flange 300 (or no flange 300).

In an alternative embodiment, the ultracapacitors 150 are laterally supported or slid into a middle support structure between the cradle members 280, 290 (or other top/bottom support plates/structures). The middle support structure may be used for fire suppression, stress relief for the cradle assembly, vibration dampening, additional structure, and/or stability.

With reference to FIGS. 2, 6A-6D, and 10, an exemplary method of assembly of the ultracapacitor pack assembly 140 will be described. First, with reference to FIG. 6A, the ultracapacitors 150 are assembled into the slots/cups 330 of the lower cradle member 290 so that lower end portions 260 of the ultracapacitors 150 rest on the annular flange 380 while the terminals 240 pass through the holes 390. Second, the upper cradle member 280 is assembled onto the ultracapacitors 150 so that top end portions 250 of the ultracapacitors 150 rest on the annular flange 380 while the terminals 240 pass through the holes 390 (i.e., top end portions 250 are assembled into the slots/cups 330). Third, the interconnects 270 are assembled so as to electrically connect terminals 240 from adjacent ultracapacitors 150 (to connect the ultracapacitors 150 in series). Fourth, the terminal heat sinks 170 are fastened to the terminals 240. Fasteners (e.g., bolts/nuts) are used to connect the flanges 300 of the cradle members 280, 290 together and the ultracapacitor pack assembly 140 is inserted into the lower cover 200. The cradle members 280, 290 generally enclose and protect the ultracapacitors 150 so that the ultracapacitor pack assembly 140 forms a module. The ultracapacitor pack assembly 140 may be supported in the ultracapacitor energy storage cell pack 110 by the flanges 300. The other components and/or circuitry of the ultracapacitor energy storage cell pack 110 may be installed into the lower cover 200 before, during, or after the ultracapacitor pack assembly 140 is assembled and inserted into the ultracapacitor energy storage cell pack 110.

The ultracapacitor pack assembly 140 is advantageous because it is quick, easy, and inexpensive to assemble/manufacture, includes fewer components that ultracapacitor pack assemblies in the past, relieves the terminals 240 from supporting the ultracapacitors 150, is vibration resistant, forms a streamlined, compact ultracapacitor pack assembly, offers excellent high voltage isolation protection, provides robust environmental protection of components, particularly the ultracapacitors 150, for heavy duty applications, and provides excellent thermal insulation to reduce system heat rejection requirements. Its modularity gives vehicle manufacturers and integrators flexibility in configuring the energy storage on the vehicle. In addition, it provides for a single, uniform module that can be used in varying numbers to meet diverse energy storage requirements.

Figure 14:
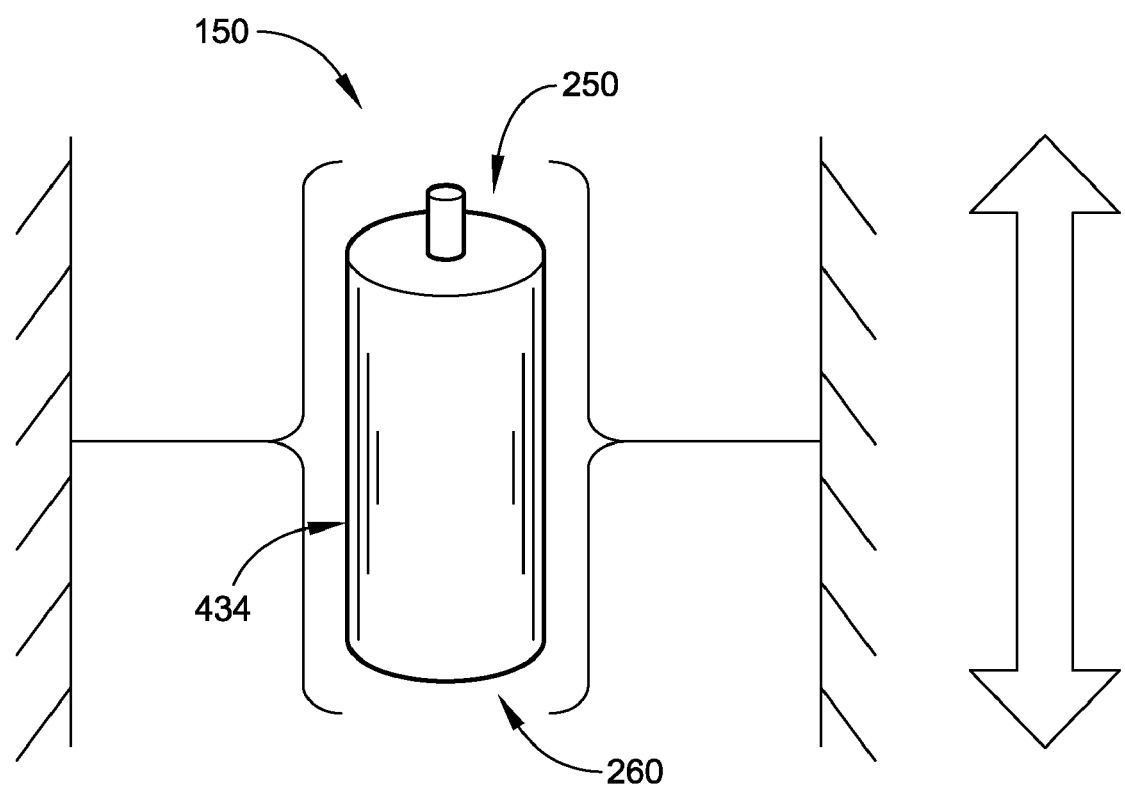
FIG. 14 is schematic view of an ultracapacitor and shows how the ultracapacitor is supported in an embodiment of the cradle assembly of the ultracapacitor pack assembly.

As illustrated in FIG. 14, the ultracapacitors 150 are disposed/supported with their longitudinal axis vertically oriented. End portions 250, 260 and body 434 of the ultracapacitors 150, as opposed to the terminals 240, are structurally supported in the slots 330 of the cradle members 280, 290, protecting the structural integrity of the ultracapacitors 150 and preventing damage to the terminals 240 or damage to the ultracapacitors 150 from being structurally supported by the terminals 240. Vibration during vehicle travel is often in a vertical (up and down) direction as shown. Structurally supporting the end portions 250, 260 and the body 434 of the ultracapacitors 150, with the ultracapacitors 150 vertically oriented as shown, protects the structural integrity of the ultracapacitors 150 during vibration of the ultracapacitor pack assembly 140 and vehicle. The cradle members 280, 290 combine to form a protective, sealed, enclosed housing/cover/box for the ultracapacitors 150, protecting the ultracapacitors 150 from dirt, dust, debris, water, and other contamination.

Figure 7:
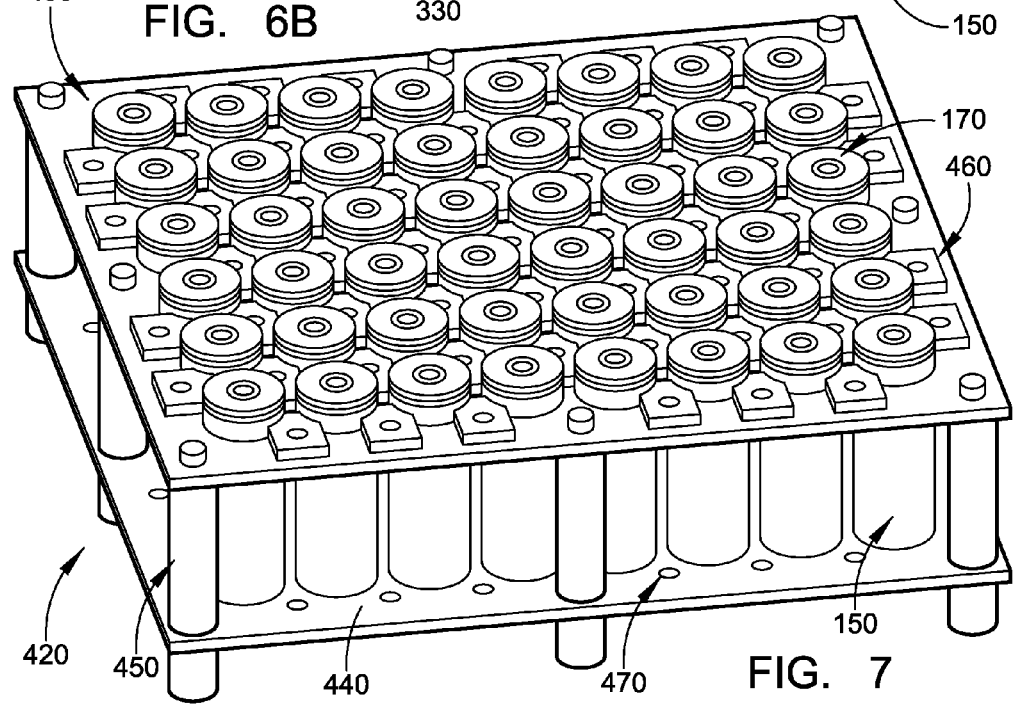
FIG. 7 is a perspective view of an alternative embodiment of an ultracapacitor pack assembly.
Figure 6C:
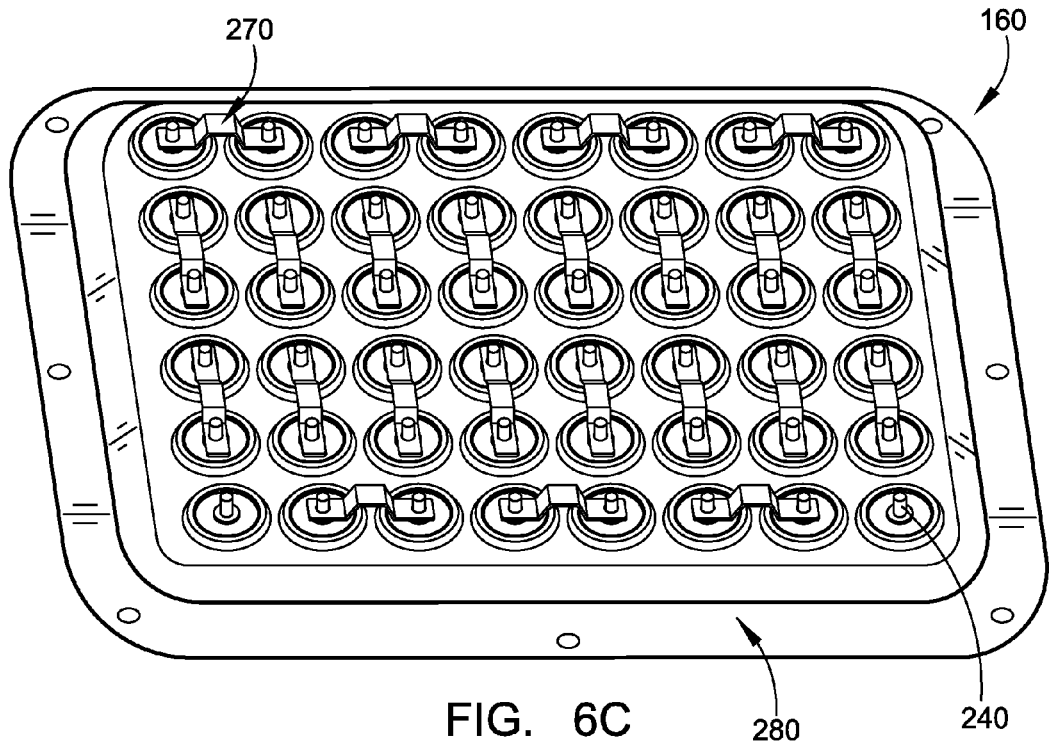
FIG. 6C is a perspective view of the ultracapacitor pack assembly of FIG. 3 after a third step in a method of assembly of the ultracapacitor pack assembly.
Figure 6D:
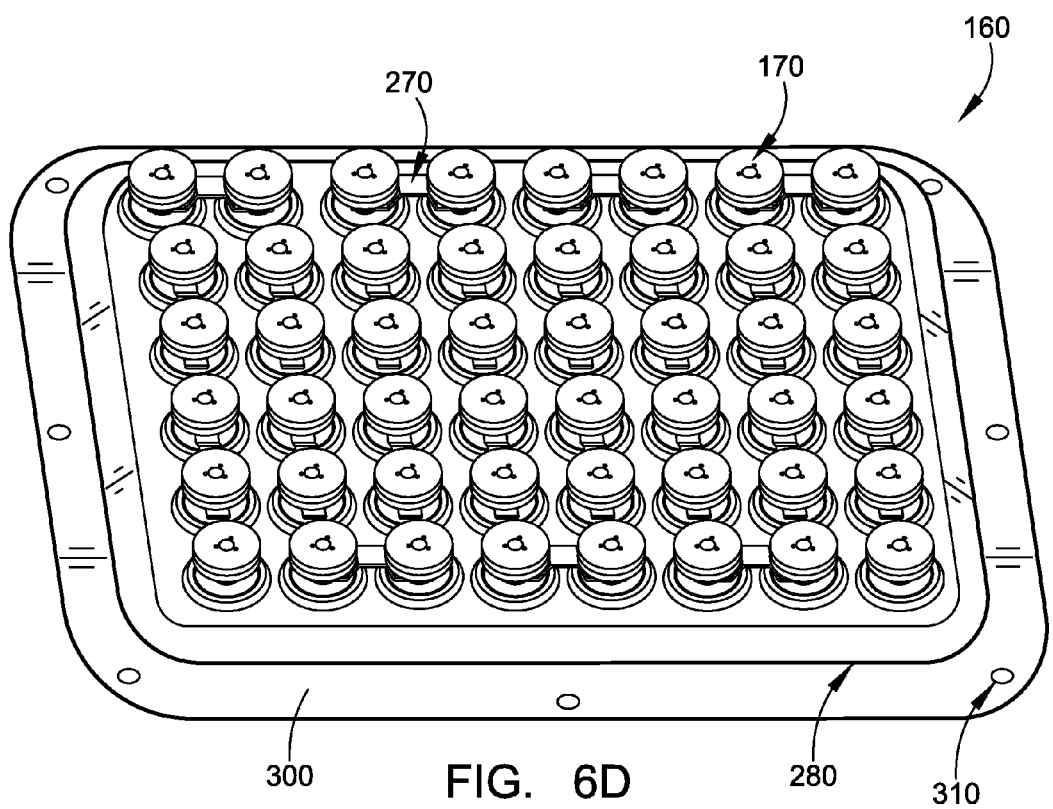
FIG. 6D is a perspective view of the ultracapacitor pack assembly of FIG. 3 after a fourth step in a method of assembly of the ultracapacitor pack assembly.

With reference to FIG. 7, an alternative embodiment of an ultracapacitor pack assembly 420 will be described. Similar to cradle assembly 160, the ultracapacitors 150 are supported by the opposing end portions 250, 260 of their casings, however, rather than wrapping down the sides of the array of ultracapacitors 150 and coupling to each other, the supporting members are kept apart and do not generally enclose the ultracapacitors 150. Instead, the upper and lower supporting members are coupled to each other via an intermediate member. In this way access is provided to the center area of the ultracapacitors 150 between their terminals 240. This may be beneficial for routing electronic circuitry (e.g., monitoring, balancing, and protection circuitry). Also, this may provide a supplemental cooling path to cool the ultracapacitor bodies 434 in addition to their terminals 240. For example, as illustrated in FIG. 7, the ultracapacitor pack assembly 420 includes an upper support board (e.g., FR4 board) 430 and a lower support board 440 with holes therein to receive end portions of ultracapacitors 150. As above, the ultracapacitors 150 are oriented along the dominant axis of vibration (See FIG. 14), which is typically vertically, as shown, for vehicle applications. Similarly, the ultracapacitors 150 are supported by their cylindrical body/case 434 rather than by their terminals 240. Vertical support members/posts 450 couple and support the support boards 430, 440 and rest of the ultracapacitor pack assembly 420 with reference to each other and to the housing 180. Plastic brackets 460 are inexpensively disposed on outer surfaces of the support boards 430, 440 for retaining the end portions of the ultracapacitors 150 in the Z-direction relative to the support boards 430, 440. Plastic blind rivets/plastic split shanks 470 are used to fasten the plastic brackets 460 to the supports 430, 440 via holes in the support boards 430, 440. It is understood that other means may be used to secure the ultracapacitor in the vertical direction. For example, upper and lower support boards may integrate a cup interface to receive and restrain the end portions 250, 260 of ultracapacitor 150. Likewise a ring section of a second board may be attached to support boards 430, 440 wherein its inner diameter is larger than the terminal but smaller than the end portion of the ultracapacitor cell, and the diameter of boards 430, 440 are approximately the same as that of the cell.

Figure 8A:
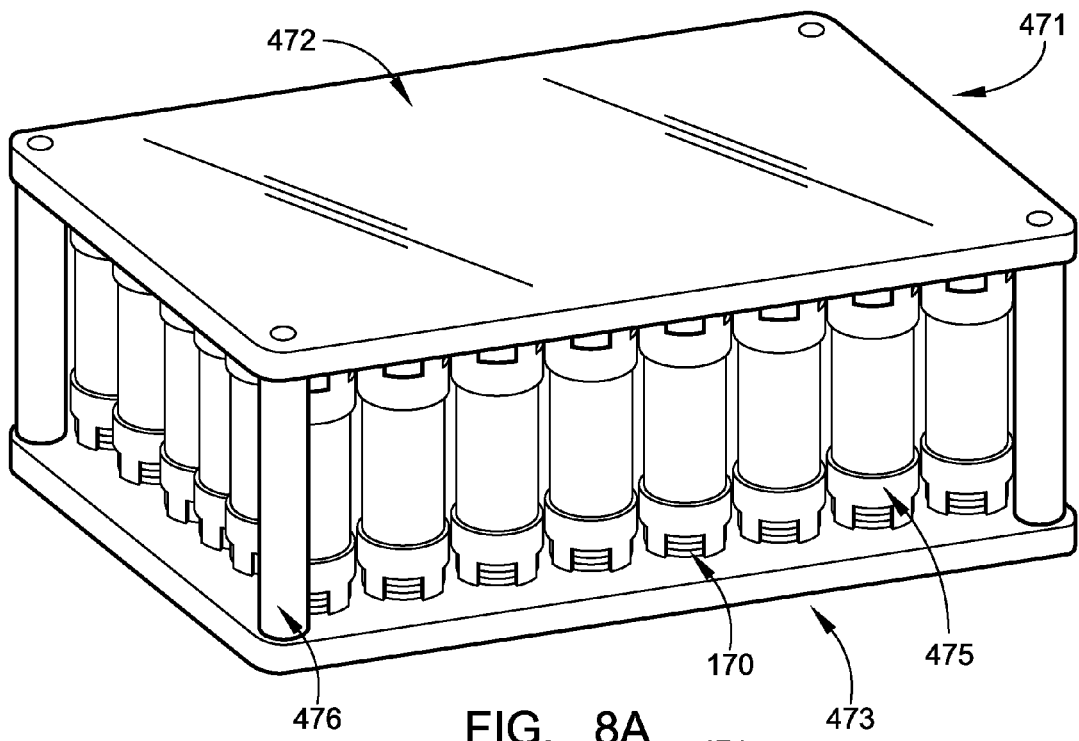
FIG. 8A is a perspective view of a further embodiment of an ultracapacitor pack assembly.
Figure 8B:
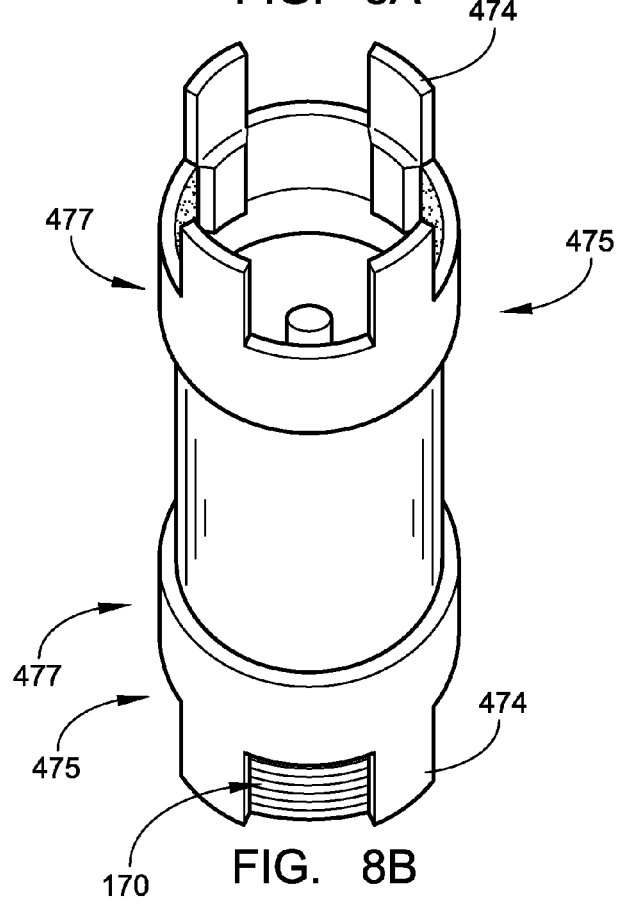
FIG. 8B is a perspective view of an ultracapacitor and an embodiment of ultracapacitor holders for spacing and securing the ultracapacitors in the ultracapacitor pack assembly of FIG. 8A.

With reference to FIGS. 8A and 8B, a further embodiment of an ultracapacitor pack assembly 471 will be described. Here, a different approach is taken. Ultracapacitors 150 are equipped with adaptors or holders that transfer support loading to their end portions 250, 260. In addition, the adaptors/holders 475 extend the interface with the ultracapacitor to provide a flow path for a coolant to convect heat. For example, as illustrated, the ultracapacitor pack assembly 471 includes an upper support plate (e.g., ABS/PVC plate) 472 and a lower support plate 473 with sets of support holes or slots on inner surfaces of the plates 472, 473 to receive spacer supports or support pegs 474 (FIG. 8B) of ultracapacitor holders 475. As above, the ultracapacitors 150 are preferably oriented along the dominant axis of vibration (See FIG. 14), which is typically vertically, as shown, for vehicle applications. Vertical support posts 476 couple and support the support plates 472, 473 and rest of the ultracapacitor pack assembly 471.

The ultracapacitor holders 475 function as extension devices, one for each end of the ultracapacitor 150. Moreover, the ultracapacitors 150 are supported by their cylindrical body/case 434 rather than by their terminals 240. As illustrated, the ultracapacitor holders 475 include annular cuffs 477 that are akin to cup holders and slidably receive end portions of the ultracapacitors 150. The support pegs 474 extend from the annular cuff 477 and are circumferentially spaced along the annular cuff 477. When assembled as shown in FIG. 8A, the ultracapacitor holders 475 perform the following functions: (1) space the ends of the ultracapacitors 150 from the inner surfaces of the support plates 472, 473; (2) provide a passage for coolant (e.g., cooled air flow) to pass over the terminal heat sinks 170 for cooling the ultracapacitors 150; and (3) provide an interface with the support plates 472, 473.

Preferably, the ultracapacitor holders 475 and the support plates 472, 473 are interfaced so that the ultracapacitor holders 475 can not rotate, translate, or pass through the support plates 472, 473. In this way coolant flow can be better controlled in a predictably way. Once the ultracapacitors 150 are positioned, the support plates 472, 473 are fastened together, thus holding the ultracapacitors 150 by their cylindrical bodies/cases 434 only. The unified structure can then be supported by a housing of the ultracapacitor pack assembly 471. This embodiment lends itself well to low cost mass production wherein the uniform end holders are placed on both ends of the ultracapacitors 150 and inserted into machined slots in the support plates. Preferably, the machined slots are keyed such that the resultant flow path is made in an optimal predetermined manner.

Figure 9A:
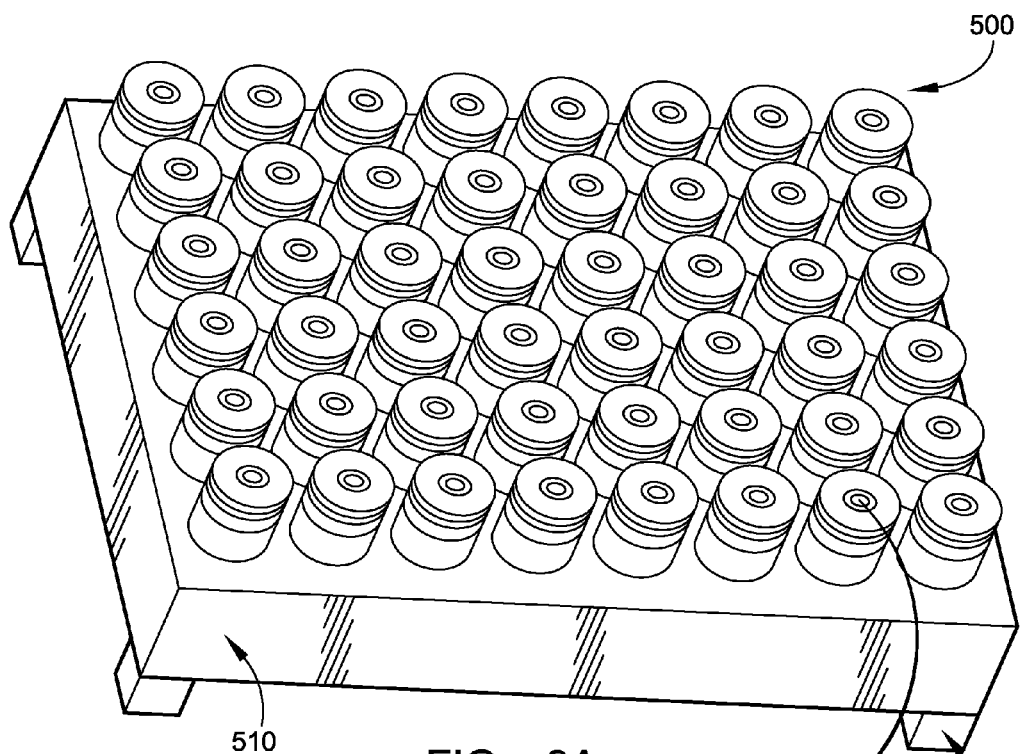
FIG. 9A is a top perspective view of a still further embodiment of an ultracapacitor pack assembly.
Figure 9B:
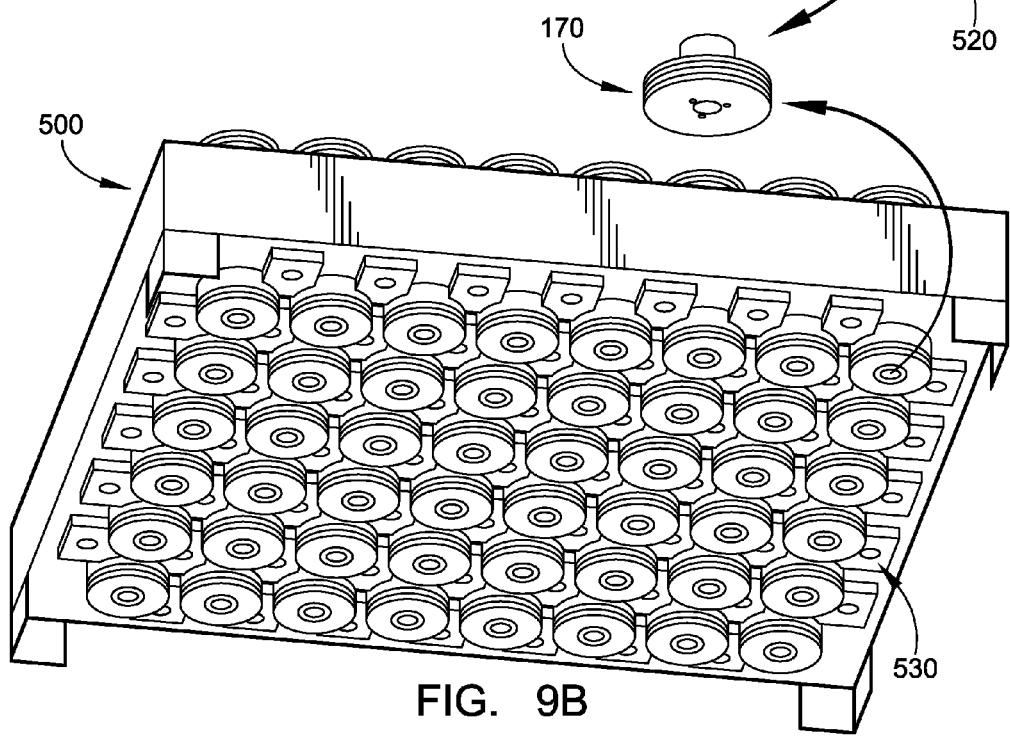
FIG. 9B is a bottom perspective view of the ultracapacitor pack assembly of FIG. 9A.

With reference to FIGS. 9A and 9B, a still further embodiment of an ultracapacitor pack assembly 500 will be described. Here, the ultracapacitor casings are supported both laterally and at their end portions. For example, as illustrated, the ultracapacitor pack assembly 500 includes a support matrix 510 (e.g., a foam or polymer core) with cylindrical holes therein having a diameter similar to the external diameter of the ultracapacitors 150 for slidably receiving/supporting the ultracapacitors 150 therein. In addition, the support matrix 510 may have plastic dividers or other support members disposed therein (e.g., elongated, thin plastic support dividers disposed between rows and/or columns of ultracapacitors 150) for adding structural support to the foam core support matrix 510 for example. Preferably, the ultracapacitors 150 are oriented along the dominant axis of vibration (See FIG. 14), which is typically vertically, as shown, for vehicle applications.

The ultracapacitors 150 are supported by their cylindrical body/case 434 rather than by their terminals 240. In particular, the ultracapacitors 150 may be held in position by friction force applied to the external surface/sides of the cylindrical body/case 434. For example, where multiple ultracapacitors 150 are supported, the ultracapacitors 150 may be held by a pressure-fit within a supporting structure (e.g., a foam core support matrix 510, a grid support structure having a friction interface (not shown), etc.). In the embodiment shown, the cylindrical holes of the support matrix 510 are slightly smaller than the external diameter of the ultracapacitors 150; the ultracapacitors 150 may be supported primarily laterally by their casings.

Alternately, the ultracapacitors 150 may be positioned and held in place by injecting foam (or other setting material) between the ultracapacitors 150 and a supporting structure. Preferably, the multiple ultracapacitors 150 are positioned in a structural grid, and then the filler material is applied. In this way, individual ultracapacitors 150 may be removed without disturbing the balance of the array. In an alternative embodiment, the structural grid may be supported by a housing of the entire energy storage pack. Alternately, when using the structural grid, the filler material may be a non-expanding friction material (e.g., rubber, epoxy, etc.) that is fixed to the grid and holds the canister in place.

Alternately, where the diameter of the cylindrical holes of the support matrix 510 are slightly larger than the external diameter of the ultracapacitors 150, the ultracapacitors 150 may be supported primarily by their end portions via end brackets fixed to the support matrix 510. For example, as illustrated and similar to FIG. 7 discussed above, plastic end brackets 530 are fastened on the lower surface of the foam core support matrix 510 for retaining the end portions of the ultracapacitors 150 in the Z direction relative to the support matrix 510.

In this and the abovementioned embodiments, support matrix 510, the filler material, and/or the grid are preferably made from a flame resistant material. Similarly, here and above, vertical support posts 520 may be used to support the support matrix 510 within the rest of the ultracapacitor pack assembly 500.

With reference to FIG. 10, the interconnects 270 and the terminal heat sinks 170 will now be described in greater detail in turn below. Each interconnect 270 forms a conductive path between the terminals 240 of two ultracapacitor cells 150. In this way multiple cells can be electrically coupled in series, thus aggregating the total voltage of the cell to a level suitable for hybrid-electric propulsion applications. For example, as illustrated here interconnect 270 may be made from a solid stamped piece of aluminum including a pair of flat terminal receivers 540 with holes 542 therein to receive the terminals 240 of the ultracapacitors 150. Additionally, interconnect 270 may include an access point for cell control and monitoring. In particular, extending upward from the flat bridge section 554 is a terminal 560 (e.g., for connecting monitoring or control circuitry such as balancing resistor(s), control circuit, etc.). Being primarily an electrical bridging device, it is preferable that interconnect 270 be sufficiently flexible so as not to induce stresses in the terminals in excess of its tolerance upon installation. For example, the flat terminal receivers 540 include a bridge 550, which may be flexible (e.g., thinner material used in bridge 550 and/or multiple preformed bends may be used to make this section flexible), having opposite upwardly angled sections 552 extending upwardly and inwardly from the flat terminal receivers 540. The opposite upwardly angled sections 552 are joined by a flat bridge section 554.

Each terminal heat sink 170 forms a thermally conductive path away from the terminal 240 of ultracapacitor cell 150 that it is mechanically coupled to. In particular, terminal heat sink 170 axially transfers heat more efficiently through the ultracapacitor terminals, instead of radially across the internal dielectric layers and through the canister walls. Further terminal heat sink 170 may include a heat exchanger having a thermal performance sufficiently high that the terminal heat sink 170 provides at least half of the required cooling of the ultracapacitor cell 150. Preferably, terminal heat sink 170 will be made of a material similar to that of the cell terminals. For example, since ultracapacitor terminals are often made of aluminum, terminal heat sink 170 could also be made of aluminum. There are several benefits of using the terminal heat sink 170 as disclosed herein. For example, while some heat exchange takes place via interconnect 270, the incorporation of cooling surfaces (e.g., fins) would tend to stiffen the interconnect and induce stress in the terminals. In addition, the omnidirectional orientation of terminal heat sink 170, as illustrated, provides for a single component/device for use on each cell, independent of the cell's orientation in the series string and further provides for simple installation.

The thermal performance required of terminal heat sink 170 will vary according to each application. In particular, it may vary depending on parameters such as the performance desired of the cell, the convection mode and media, the flow rate of the convection media, the thermal gradient between the cell and coolant, etc. Once the parameters are known, the systemic heat transfer coefficient and terminal heat sink thermal performance may be determined as a result of a standard computational fluid dynamics (CFD) analysis. By cooling axially at the terminals, the cells may be cooled much more efficiently and/or the cells may have higher performance, making the energy storage better suited for hybrid-electric propulsion applications.

As illustrated in FIG. 10, the terminal heat sink 170 forms an energy storage cell terminal cooler/exchanger, or a device that radiates heat from an individual terminal 240. The terminal heat sink 170 couples to the terminal 240 and provides a heat exchange surface to the surrounding environment. In the embodiment shown, the cooling fins 580 form a convective heat exchange surface in an air flow path. The heat exchange surface may be integrated into a fastener for the terminal 240 (e.g., a threaded nut 570). Accordingly, the terminal heat sink 170 may both couple items to the ultracapacitor 150 terminal as needed and cool the terminal end of the ultracapacitor 150 at the same time. In another embodiment, the terminal heat sink 170 is configured to bolt a busbar (or other terminal-to-terminal interconnector/electrical bridging device) to the ultracapacitor 150. According to another embodiment, the terminal heat sink 170 may be configured to provide lateral support (i.e., along the longitudinal axis of the ultracapacitor 150) so as to support the ultracapacitor 150 within a housing or enclosure. By providing more efficient cooling and moving the heat exchange location away from the canister walls, the terminal heat sinks 170 enable the ultracapacitors 150 to be packed more closely to each other so that cooling air is primarily passed across the terminal ends. By doing so, there is less need for a large cooling air/heat exchange path between the ultracapacitors 150.

According to one exemplary construction, and as illustrated in FIG. 10, each terminal heat sink 170 includes a nut 570 with a threaded interior for threadably receiving externally threaded terminal 240 (see also, FIG. 11C ref. 620). The nut 570 is welded to a cylindrical tube (not shown). The nut 570 and/or the tube form a receiving section for structurally receiving externally threaded terminal 240. Annular washers or cooling fins 580 circumferentially surround and extend radially from the cylindrical tube. A top of the terminal heat sinks 170 may include a rotate engagement mechanism/recessed tool interface 590 for rotatable engagement by/with a rotatable tool for screwing the terminal heat sink 170 on/off the externally threaded terminal 240. In the embodiment shown, the rotate engagement mechanism 590 includes a "key" interface; particularly, three geometrically spaced cylindrical female sections (e.g. bores) for receiving three corresponding male members of a rotatable tool for screwing the terminal heat sink 170 on/off the externally threaded terminal 240. Thus a key is required to remove the terminal heat sink 170, providing added security against unauthorized disassembly. In alternative embodiments, the rotate engagement mechanism 590 may include other configurations/structures (e.g., screwdriver slot, Allen stock recess) for rotatable engagement by/with a rotatable tool. The rotate engagement mechanism 590 is also important for controlling the amount of torque applied to the threaded terminal 240 so that the terminals 240 and ultracapacitors 150 are not damaged by applying too much torque. The rotate engagement mechanism 590 is preferably recessed in the top/exposed end of the terminal heat sink 170 since it is preferable that whatever rotatable tool is used to screw/unscrew the terminal heat sink 170 comes in from the top/exposed portion of the threaded terminals 240.

With reference to FIGS. 11A-11C, an alternative construction of a terminal heat sink 610 will be described. The terminal heat sink 610 is generally similar to the terminal heat sink 170 described above except that the terminal heat sink 610 includes an interiorly threaded nut 620 disposed above the cooling fins 580 instead of below the cooling fins 580 as with the heat sink 170 of FIG. 10. Annular washers or cooling fins 580 circumferentially surround and extend radially from cylindrical tube 630. Cylindrical tube 630 may be smooth or internally threaded. In the terminal heat sink 610, the nut 620 is a standard hexagonal nut. The standard hexagonal outer surface of the nut 620 forms a rotate engagement mechanism for rotatable engagement by/with a rotatable tool (e.g., wrench) for screwing the terminal heat sink 610 on/off the externally threaded terminal 240.

As shown in FIG. 11C and discussed above, heat radiates in a longitudinal axial direction outwards, towards the terminals 240, in the direction of the arrows shown. The heat is transferred to the terminals 240, and from the terminals 240, through the nut 620/tube 630 and to the cooling fins 580.

Convective cooling air flows past the cooling fins 580 to transfer heat therefrom to cool the ultracapacitor 150.

According to one exemplary construction, the terminal heat sink 610 may be simply, quickly, and easily manufactured by sliding L-type annular washer(s) 580 along the outside of the tube 630 into desired positions and enlarging the outer diameter of the tube 630 relative to an inner diameter of annular L-type washers (e.g., by forcing a ball bearing having a larger diameter than an inner diameter of the tube 630 through the tube 630) so that the washers are fixed to the tube 630. Alternatively, the washer(s) 580 may then be welded (or otherwise fixed) to the end of the tube 630. Alternatively, terminal heat sink 610 is manufactured by sliding L-type annular washers along the outside of the tube 630 into desired positions and fixing the inner annular portion of annular L-type washers to the outer circumference of the tube 630 and fixing the nut 620 to end of the tube 630. Fixing the components together may be performed by brazing, welding, and/or other fixing techniques.

In alternative embodiments of the terminal heat sink 170, 610, the number and/or configuration(s) of the heat fins 580 may vary/differ from that shown. For example, but not by way of limitation, in one or more embodiments, terminal heat sink 170, 610 includes one or more of the following features, the terminal heat sink 170, 610 radiates outwardly in a symmetric configuration from the receiving section, the symmetric configuration is annular, and/or the symmetric configuration is at least one of curvilinear (e.g., circular, annular, oval) and rectilinear (e.g., square, rectangular, rhomboid, parallelogram). However the fins are preferably circular, in this way the terminal heat sink 170, 610 provides omnidirectional cooling and may be installed in any direction, thus making installation quicker. Also, the dimensions of the heat fins 580 are preferably less than the diameter/dimensions of the ultracapacitors 150. For example, but not by way of limitation, the outer diameter of the heat fins 580 is less than the outer diameter of the ultracapacitor 150. This minimizes the separation of adjacent cells and interaction between adjacent terminal heat sinks 170, 610. Additionally, the first fin (closest to the ultracapacitor 150 end may be in direct contact with the end of the cell for increased heat transfer, or alternately may stand off the end of the cell for increased coolant flow and convection.

The terminal heat sink 170, 610 is advantageous because, but not by way of limitation, it extracts heat from the ultracapacitor cell in a thermally efficient manner and without the need for a high flow cooling system. The terminal heat sink 170, 610 provides a low-cost, simple solution for transferring heat from the ultracapacitors 150. The terminal heat sink 170, 610 provides cooling for individual ultracapacitors 150, and provides maximum cooling at the points (i.e., terminal ends) of highest heat. The terminal heat sink 170, 610 also allows for a more compact form factor in the ultracapacitor pack assembly because the ultracapacitors 150 can be placed closer together since cooling occurs at the terminals 240 and not at the cylindrical body/case 434. Similarly, since the cells are cooled more efficiently, less cooling air is required and consequently much less energy is required to perform the same cooling.

Figure 12:
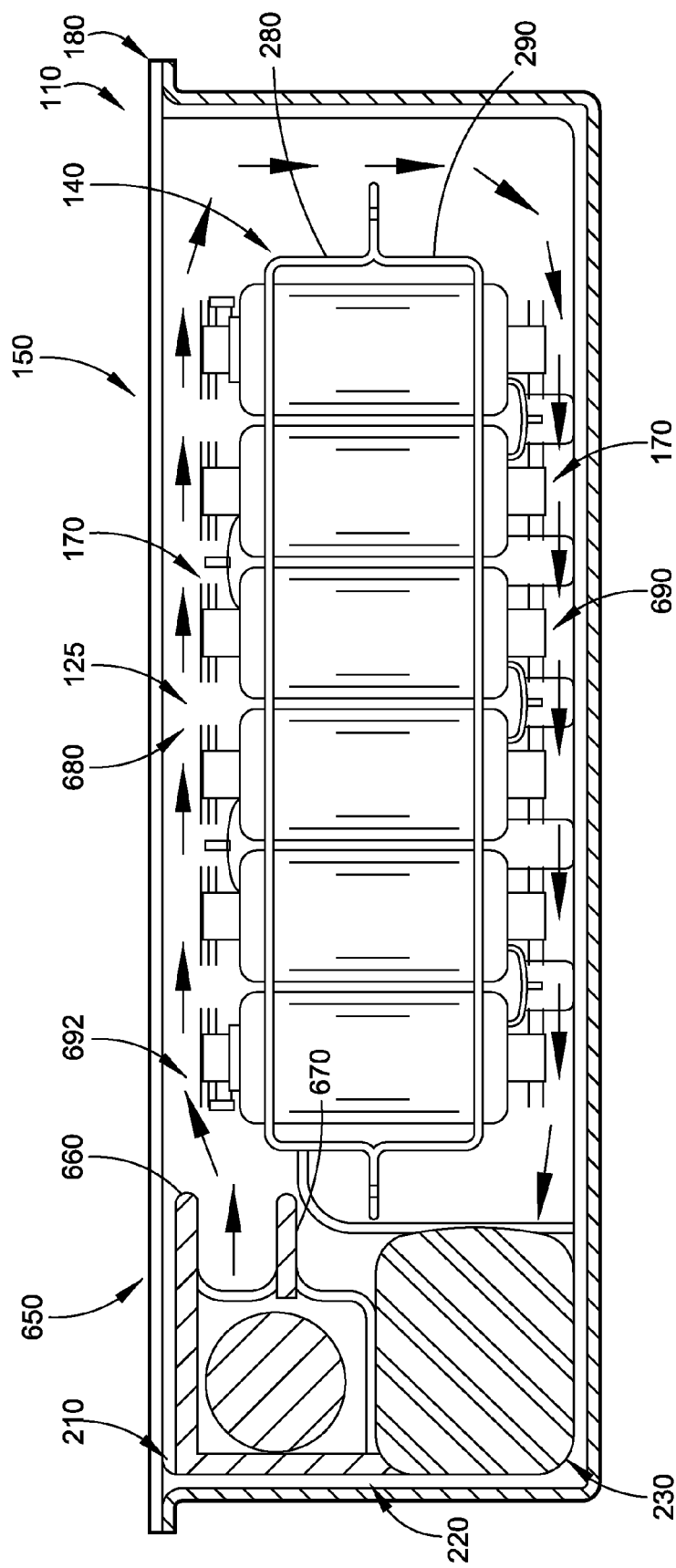
FIG. 12 is a cross sectional view of an embodiment of an ultracapacitor pack cooling system of the ultracapacitor energy storage cell pack of FIG. 2.

With reference to FIG. 12, an embodiment of ultracapacitor pack cooling system 650 for the ultracapacitor energy storage cell pack 140 will be described. Preferably, ultracapacitor pack cooling system 650 is a closed loop system. In this way, external contaminates commonly found in hybrid vehicles are excluded from the energy storage, thus extending its life and reliability. The ultracapacitor pack cooling system 650 includes the blower and cooler assembly 210 disposed within one end of the housing 180. The blower and cooler assembly 210 includes the cross flow fan/flow source 220 and the heat exchanger 230. The cross flow fan/flow source 220 and the heat exchanger 230 are laterally elongated and extend substantially the entire lateral length of the ultracapacitor energy storage cell pack 140. In other words, the width of the cross flow fan/flow source 220 and the heat exchanger 230 is substantially the same width of each row (e.g., 6 rows shown in embodiment of FIG. 2). Of course, cross flow fan/flow source 220 may be a fan extending the length of first row 692 of ultracapacitors 150, or it may include the combination of a smaller fan and ducting or vanes distributing the flow to first row 692 of ultracapacitors 150. Preferably, a, front portion of the cross flow fan/flow source 220 includes upper guide 660 and lower guide 670 that form a shroud for directing air flow from the cross flow fan/flow source 220 in the manner shown in FIG. 12 and minimizes leakage.

Coolant flow or a coolant flow path 680 flows over and through the upper terminal heat sinks 170, causing convective cooling of the cooling fins 580 (transferring heat from the upper terminals 240) to cool the ultracapacitors 150. Air flows around an opposite end of the ultracapacitor energy storage cell pack 140 and back to the heat exchanger 230 via a return flow or return flow path 690. Similar to the convective cooling that occurs in the coolant flow path 680, the return flow 690 flows over and through the lower terminal heat sinks 170, causing convective cooling of the cooling fins 580 (transferring heat from the lower terminals 240) to cool the ultracapacitors 150. Generally, air flow will be substantially or completely blocked from crossing/bleeding over the side of the ultracapacitor energy storage cell pack 140. This may be accomplished with dedicated ducting/blockage/sealants and/or configuring structures such as the housing 180 or cradle assembly 160 to perform this task.

According to the illustrated embodiment, the temperature of the return flow 690 is higher than the temperature of the coolant flow path 680 because the return flow 690 includes the heat removed from upstream flow across the terminal heat sinks 170. Thus, the temperature gradient associated with the air flow above the first row 692 of ultracapacitors 150 is the highest and the temperature gradient associated with the air flow below the first row 692 of ultracapacitors 150 is the lowest. Since, heat transfer occurs in a longitudinal axial direction outwards, towards the terminals 240, in the direction of the arrows shown in FIG. 11C, and in light of the varying temperature gradients, the first row of cells may experience greater cooling at the top terminal than at the bottom terminal, whereas the last row of cells may experience a more even cooling at the top and bottom terminals. However, the average temperature of the air flow above and below each row of ultracapacitors 150 is the same for every row (i.e., every row has the same average temperature). As a result, each row of ultracapacitors 150 (as well as all ultracapacitors 150) are cooled the same.

The heat exchanger 230 removes the added heat from the return flow 690 from the energy storage cell pack 110. Heat exchanger 230 may utilize an external cooling supply as well. For example, preferably heat exchanger 230 will be integrated in a vehicle cooling system. In particular, a coolant will pass through the energy storage cell pack 110 extracting heat from the hotter air flow. This may be accomplished by passing the coolant through a finned tube and passing the heated air flow across it. With reference additionally to FIG. 1, the heat exchanger 230 from each ultracapacitor energy storage cell pack 110 may be connected to a central water chiller or cooling supply 120 for transferring coolant through the heat exchangers 230 for removing heat from the ultracapacitor energy storage cell packs 110. The flowing coolant takes heat from the ultracapacitors 150, and the heat in the coolant is removed with the heat exchanger 230. The controller 130 may control cooling of the ultracapacitor energy storage cell packs 110 measuring the temperature of the packs and metering the coolant flow and/or temperature. Additionally, the heat exchanger 230 may be located external to the housing; however the cooling air of the pack is preferably part of a closed-loop system.

According to the preferred embodiment shown, both the cross flow fan/flow source 220 and the heat exchanger 230 are integrated into the ultracapacitor energy storage cell pack 110. Preferably, the heat exchanger 230 is cooled externally using coolant from either the vehicle cooling system (not shown) or a central water chiller or cooling supply 120 (FIG. 1). In an alternative embodiment, one or both of the cross flow fan/flow source 220 the heat exchanger 230 are not integrated into the ultracapacitor energy storage cell pack 110.

According to the embodiment shown, the ultracapacitors 150 are vertically arranged in a single-level array, and the coolant (e.g., air) will pass over the top (and/or or bottom) of the ultracapacitors 150, wrap around, and enter the heat exchanger 230 to extract heat. The terminal heat sinks 170 on the terminals 240 form mini heat exchangers (e.g., finned nuts) so as to improve the transfer of heat from the terminals 240 to the coolant. This design is particularly good with ultracapacitors 150 because the internal construction of the ultracapacitors 150 makes it far more efficient to extract heat from the terminals 240 rather than the cases/cylindrical body 434 of the ultracapacitors 150. This is true even though there is much more surface area around the external surface of the cases/cylindrical body 434 than the external surface of the terminal 240, making this cooling approach counterintuitive, especially since one would think that enclosing the hot ultracapacitors 150 in a sealed, enclosed box would raise the temperature of the ultracapacitors 150. As shown in FIG. 11C, heat radiates in a longitudinal axial direction outwards, towards the terminals 240, in the direction of the arrows shown. The heat is transferred to the terminals 240, and from the terminals 240, through the tube 630 and to the cooling fins 580. According to one embodiment, as shown in FIG. 12, the cooling air is propelled by cross flow fan 220 in a linear, uniform flow across the terminal heat sinks 170. This cross flow fan (also called a tangential flow fan) provides for uniform and predictable heat transfer. As illustrated, the cross flow fan 220 efficiently redirects the air flow from the integrated heat exchanger 230 back over the terminal heat sinks 170, thus closing the ultracapacitor cooling loop. The cross flow fan 220 spans the long profiles associated with the cell array in the most efficient manner (compared to, for example, axial fans and centrifugal fans, which may require multiple motors and add bulk to the housing, based on their principles of operation). The above closed-loop cooling strategy/system provides active cooling, allowing operation of the ultracapacitor pack in all climates, and provides consistent cell-to-cell temperature control as compared to open loop systems that may vary depending on ambient conditions.

As used in a hybrid electric vehicle, some of the characteristics of the ultracapacitor energy storage cell pack 110 may include a rated voltage of 2.3×48=110.4 V, a recommended max voltage of 2.5×48=120 V, a surge voltage of 2.7×48=129.6 V, an isolation voltage of 2500 V, a rated continuous current of 150 A (peak of 300 A), a leakage current of <5 mA, a number of 48 cells (each rated at 3000 F) in the module, a lifetime of 40000 hrs (based on a continuous 33 kW cycle), 1 million Cycles (50% DoD), capacitance of 62.5 F, total energy stored nominal of 105.8 Wh (2.3 V/cell), total energy stored peak of 125 Wh (2.5 V/cell), DC ESR of 16.5 mOhms, heat rejection of 3 kW, cooling water of 30-35 degrees C. at 10 gpm (plumbed in parallel), a storage temperature of −40 degrees C. to 70 degrees C., an operating ambient temperature of −40 degrees C. to 50 degrees C., and a vibration meeting SAE J2380 & J244, an IP rating of IP67, an IEC rating of iec 529 (Type 5), a height dimension of no more than 13 in., a length dimension of no more than 15 in., and a width dimension of no more than 17 in., and a total dimension/volume that does not exceed 13 in.×15 in.×17 in. In addition, while there is no maximum limit to the spacing between the ultracapacitors, preferably there should be no more that 0.25 in.-0.50 in. between the casings of the cells.

Some of the characteristics of the ultracapacitor pack system 100 include a supply voltage of 230 VAC, a rated voltage of 110.4×6=662 V, a recommended max voltage of 120×6=720 V, a surge voltage of 129.6×6=777 V, an isolation voltage of 2500 V, a rated continuous current of 150 A, a rated peak current of 300 A, a leakage current of <5 mA, a number of modules/ultracapacitor energy storage cell packs 110 of 6 modules in the ultracapacitor pack system 100, a lifetime of 40000 hrs (based on a continuous 33 kW cycle), 1 million Cycles (50% DoD), capacitance of 10.4 F, total energy stored nominal of 634 Wh (2.3 V/cell), total energy stored peak of 750 Wh (2.5 V/cell), DC ESR of 98 mOhms, heat rejection of 3 kW (10236 BTU/hr), cooling water of 30-35 degrees C. at 10 gpm (0.758 L/s), a storage temperature of −40 degrees C. to 70 degrees C., an operating ambient temperature of −40 degrees C. to 50 degrees C., a maximum ambient temperature range inlet of 60 degrees C., vibration meeting SAE J2380 & J244, 144 temperature sensors, an IP rating of IP67, an IEC rating of iec 529 (Type 5), a Beginning of Life (BOL) power loss of no more than 2251 W, and an End of Life (EOL) power loss of no more than 2701 W.

The ultracapacitor pack system 100 preferably includes ground fault circuit protection, a CAN vehicle interface, contactor protection hardware/software, microprocessor controlled cell equalization and monitoring, integral DC Bus precharge resistor(s), fast-acting fuse that reduces damage to DC bus components in event of a short circuit, diagnostic and prognostic functions to predict faults before they occur, and a monitoring system that monitors the voltage and temperature of every capacitor 150 to eliminate hidden cell failures.

Figure 13:
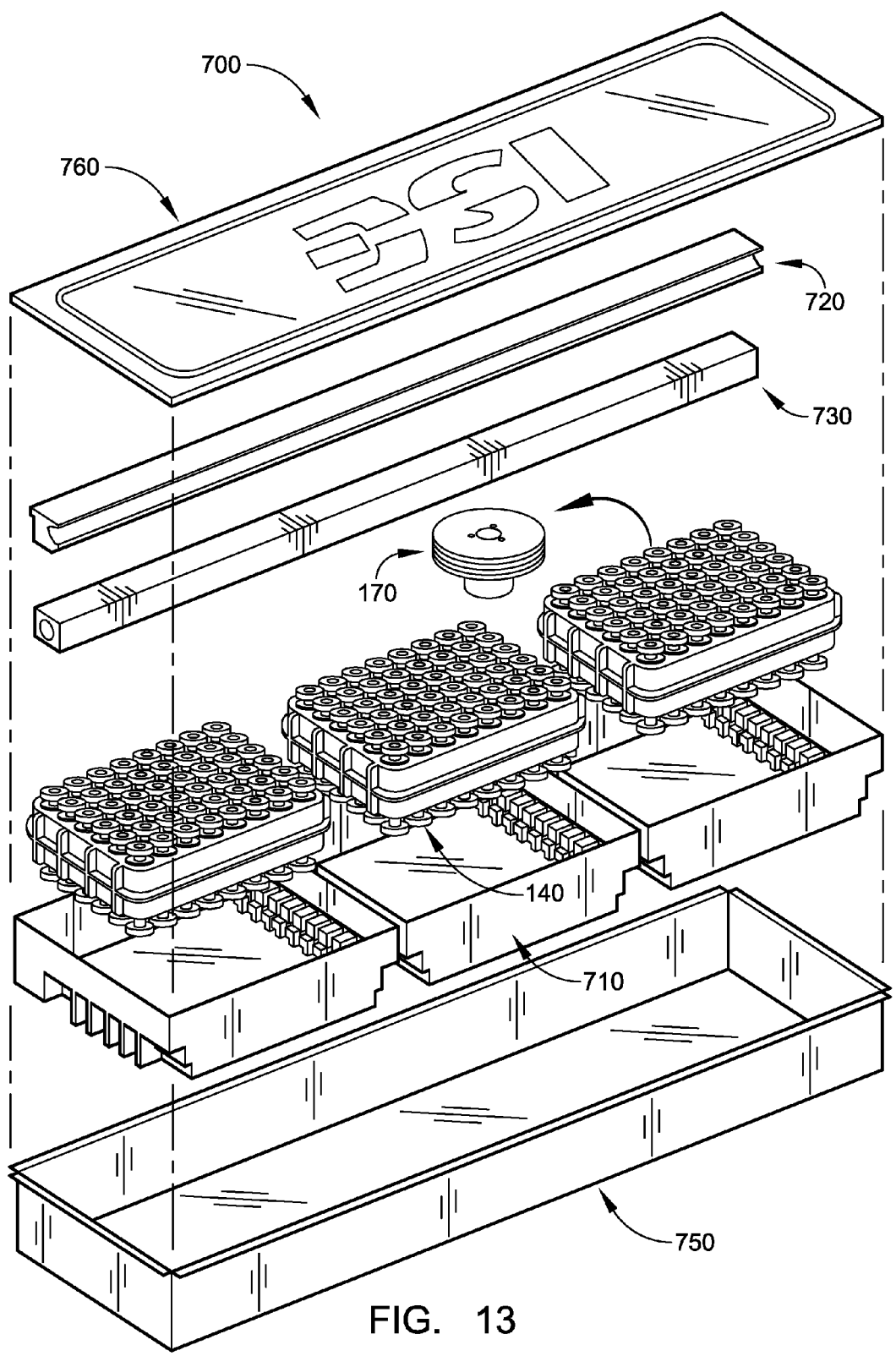
FIG. 13 is a perspective view of an alternative embodiment of an ultracapacitor energy storage.

With reference to FIG. 13, an alternative embodiment of an ultracapacitor energy storage cell pack 700 will be described. The ultracapacitor energy storage cell pack 700 is generally similar to the ultracapacitor energy storage cell pack 110 of FIG. 2, except instead of the ultracapacitor energy storage cell pack 110 including a single ultracapacitor energy storage cell pack assembly 140, the ultracapacitor energy storage cell pack 700 includes more than one (e.g., 3) ultracapacitor energy storage cell pack assembly 140 disposed in respective inner thermoform liners 710 designed to readily receive all the components (e.g., ultracapacitor pack assemblies 140) of the ultracapacitor energy storage cell pack 700 for quick, inexpensive, and easy assembly. A single elongated cross-flow fan 720 and a single heat exchanger 730 are used to cool the multiple ultracapacitor energy storage cell pack assemblies 140. The single elongated cross-flow fan 720, the single heat exchanger 730, and the multiple ultracapacitor energy storage cell pack assemblies 140/inner thermoform liners 710 are disposed within a housing including a lower cover or sheet metal casing 750 and an upper cover or top 760. The single heat exchanger may supply its own cooling or may be connected to a central water chiller or cooling supply 120 as described above for transferring coolant through heat exchanger(s) 730 for removing heat from one or more ultracapacitor energy storage cell packs 700.

The above figures may depict exemplary configurations for the invention, which is done to aid in understanding the features and functionality that can be included in the invention. The invention is not restricted to the illustrated architectures or configurations, but can be implemented using a variety of alternative architectures and configurations. Additionally, although the invention is described above in terms of various exemplary embodiments and implementations, it should be understood that the various features and functionality described in one or more of the individual embodiments with which they are described, but instead can be applied, alone or in some combination, to one or more of the other embodiments of the invention, whether or not such embodiments are described and whether or not such features are presented as being a part of a described embodiment. Thus the breadth and scope of the present invention, especially in the following claims, should not be limited by any of the above-described exemplary embodiments.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although item, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. An energy storage cooling system for a vehicle energy storage pack, the vehicle energy storage pack including a plurality of ultracapacitor cells and an external housing configured to enclose the plurality of ultracapacitor cells, the energy storage cooling system comprising:
   a plurality of terminal heat exchangers, each terminal heat exchanger thermally coupled to one terminal of one of the plurality of ultracapacitor cells and configured to convect heat from its respective one terminal to a gas coolant, the plurality of terminal heat exchangers located inside the external housing;
   a blower including a blower inlet and a blower exhaust, the blower configured to blow the gas coolant from the blower exhaust across the plurality of terminal heat exchangers with the gas coolant convecting heat from the plurality of terminal heat exchangers, the blower located inside the external housing;
   a liquid coolant heat exchanger configured to receive and cool heated gas coolant, and further configured to feed cooled gas coolant to the blower inlet, the liquid coolant heat exchanger located inside the external housing;
   a closed loop gas coolant flow path inside the external housing, the closed loop gas coolant flow path configured to direct the gas coolant from the blower across the plurality of terminal heat exchangers and to the liquid coolant heat exchanger;
   an external liquid cooling source configured to receive heated liquid coolant from the liquid coolant heat exchanger and return cooled liquid coolant back to the liquid coolant heat exchanger;
   a liquid coolant loop interfacing with the external liquid cooling source and the liquid coolant heat exchanger, liquid coolant loop configured to circulate liquid coolant between the liquid coolant heat exchanger and the external liquid cooling source.

2. The energy storage cooling system of claim 1, wherein each of the plurality of terminal heat exchangers includes a plurality of fin surfaces, and is configured to screw on to its respective terminal.

3. The energy storage cooling system of claim 1, further comprising:
   at least one temperature sensor associated with the plurality of ultracapacitor cells; and,
   a controller configured to actively control cooling of the plurality of ultracapacitor cells in response to the at least one temperature sensor, and wherein the controller is configured to meter at least one of liquid coolant flow, liquid coolant temperature, and gas coolant flow.

4. The energy storage cooling system of claim 3, wherein the controller is configured to cool multiple vehicle energy storage cell packs simultaneously.

5. The energy storage cooling system of claim 1, wherein the closed loop gas coolant flow path comprises ducting configured to direct the gas coolant from the blower, across the plurality of terminal heat exchangers, and back to the liquid coolant heat exchanger.

6. The energy storage cooling system of claim 1, wherein the external liquid cooling source comprises a vehicle cooling system.

7. The energy storage cooling system of claim 1, wherein the external liquid cooling source comprises a vehicle cooling system, a central water chiller, or a dedicated cooling supply.

8. The energy storage cooling system of claim 1, wherein the external liquid cooling source is configured to cool multiple vehicle energy storage cell packs simultaneously.

9. The energy storage cooling system of claim 1, wherein the gas coolant comprises air.

10. An energy storage cooling system for a propulsion energy storage pack in a vehicle, the vehicle having an electric drive system and a vehicle cooling system, the propulsion energy storage pack including a plurality of energy storage cells and an external housing configured to enclose the plurality of energy storage cells, the energy storage cooling system comprising:
   a plurality of terminal heat exchangers, each terminal heat exchanger thermally coupled to one terminal of one of the plurality of energy storage cells and configured to convect heat from its respective one terminal to a gas coolant;
   a liquid coolant heat exchanger configured to cool heated gas coolant;
   a closed loop gas coolant flow path at least partially inside the propulsion energy storage pack, and configured to guide gas coolant across the plurality of terminal heat exchangers, then to the liquid coolant heat exchanger, the closed loop gas coolant flow path sealed from ambient air and contaminants outside the propulsion energy storage pack;

means to circulate gas coolant through the closed loop gas coolant flow path, convecting heat from the plurality of terminal heat exchangers, and convecting heat to the liquid coolant heat exchanger;

an external liquid cooling source;

a liquid coolant loop at least partially outside the propulsion energy storage pack interfacing with the external liquid cooling source and the liquid coolant heat exchanger, liquid coolant loop configured to circulate liquid coolant between and interface with the liquid coolant heat exchanger and the external liquid cooling source.

11. The energy storage cooling system of claim 10, wherein the energy storage cells are ultracapacitors.

12. The energy storage cooling system of claim 10, wherein the means to circulate gas coolant through the closed loop gas coolant flow path comprises a blower, the blower having a blower inlet and a blower exhaust.

13. The energy storage cooling system of claim 12, wherein the liquid coolant heat exchanger is coupled to the blower such that cooled gas coolant is delivered from the liquid coolant heat exchanger to the blower inlet.

14. The energy storage cooling system of claim 10, wherein the external liquid cooling source comprises the vehicle cooling system, the external liquid cooling source configured to receive heated liquid coolant from the liquid coolant heat exchanger and to return cooled liquid coolant to the liquid coolant heat exchanger via the liquid coolant loop.

15. The energy storage cooling system of claim 10, wherein the external liquid cooling source comprises a central water chiller or cooling supply, the external liquid cooling source configured to receive heated liquid coolant from the liquid coolant heat exchanger and to return cooled liquid coolant to the liquid coolant heat exchanger via the liquid coolant loop.

16. The energy storage cooling system of claim 10, wherein both the liquid coolant heat exchanger and the means to circulate gas coolant through the closed loop gas coolant flow path are located outside the external housing of the propulsion energy storage pack.

17. The energy storage cooling system of claim 10, wherein at least part of one inner surface of the external housing forms at least part of the closed loop gas coolant flow path.

18. The energy storage cooling system of claim 10, wherein the closed loop gas coolant flow path comprises ducting configured to direct gas coolant across the plurality of terminal heat exchangers and limit gas coolant from bleeding out or otherwise escaping the closed loop gas coolant flow path.

19. The energy storage cooling system of claim 10, wherein the gas coolant is air and the liquid coolant is water-based.

* * * * *